United States Patent
Han et al.

(10) Patent No.: US 9,040,884 B2
(45) Date of Patent: May 26, 2015

(54) APPARATUS FOR FABRICATING SEMICONDUCTOR DEVICES

(75) Inventors: Il-Young Han, Uiwang-si (KR); Jae-Sung Kwon, Yongin-si (KR); Sang-Wook Park, Hwaseong-si (KR); Won-Keun Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 707 days.

(21) Appl. No.: 13/412,674

(22) Filed: Mar. 6, 2012

(65) Prior Publication Data
US 2012/0298656 A1 Nov. 29, 2012

(30) Foreign Application Priority Data
May 24, 2011 (KR) .................. 10-2011-0049091

(51) Int. Cl.
*H05B 6/80* (2006.01)
*H01L 21/00* (2006.01)
*H01L 21/263* (2006.01)
*H01L 21/67* (2006.01)

(52) U.S. Cl.
CPC .... *H01L 21/67115* (2013.01); *H01L 21/67178* (2013.01); *H01L 21/6719* (2013.01); *H05B 6/80* (2013.01)

(58) Field of Classification Search
CPC ............ H01L 21/67115; H01L 21/6719; H01L 21/67178; H05B 6/80
USPC ............ 219/756, 757, 754, 385, 536, 411, 219/441.1, 390; 156/382, 538, 345.1; 392/416, 407, 408; 438/795, 799, 796, 438/798; 118/50.1, 724, 725; 165/61, 63, 165/64
See application file for complete search history.

(56) References Cited

U.S. PATENT DOCUMENTS

| | | | |
|---|---|---|---|
| 5,644,837 A | 7/1997 | Fathi et al. | |
| 2004/0018751 A1* | 1/2004 | Kusuda | 438/795 |
| 2006/0104870 A1 | 5/2006 | Rumps et al. | |
| 2006/0289526 A1 | 12/2006 | Takizaki et al. | |
| 2008/0087662 A1 | 4/2008 | Takizaki et al. | |
| 2009/0093135 A1* | 4/2009 | Matsushita et al. | 438/798 |
| 2009/0321432 A1 | 12/2009 | Han et al. | |
| 2010/0074604 A1* | 3/2010 | Koelmel et al. | 392/408 |

FOREIGN PATENT DOCUMENTS

| | | |
|---|---|---|
| JP | 2004335361 | 11/2004 |
| KR | 100475793 | 3/2005 |
| KR | 1020100002532 | 1/2010 |
| KR | 100976264 | 8/2010 |

* cited by examiner

Primary Examiner — Quang Van
(74) Attorney, Agent, or Firm — Onello & Mello, LLP

(57) ABSTRACT

An apparatus for fabricating semiconductor devices includes a chamber having a bottom plane, a side wall and a lid. An irradiating unit is at an interior of the chamber. A substrate mounting unit is between the bottom plane of the chamber and the irradiating unit. The irradiating unit includes an irradiating tube and a hole penetrating the central region of the irradiating tube. The irradiating tube has a hollow disk shape, and a lower surface of the irradiating tube is opened to the substrate mounting unit.

20 Claims, 18 Drawing Sheets

APPARATUS FOR FABRICATING SEMICONDUCTOR DEVICES

CROSS-REFERENCE TO RELATED APPLICATION

This application claims priority under 35 U.S.C. §119 to Korean Patent Application No. 10-2011-0049091 filed on May 24, 2011, the entire contents of which are incorporated herein by reference.

BACKGROUND

1. Field

Example embodiments of the inventive concepts relate to an apparatus for fabricating semiconductor devices.

2. Description of Related Art

Generally, a semiconductor substrate may include a polymer film in an uppermost level thereof which is formed in a step of a fabrication process of a semiconductor package. In the process of fabricating a semiconductor package, the polymer film may need to be hardened by an apparatus which fabricates semiconductor devices.

SUMMARY

Example embodiments of the inventive concepts provide an apparatus for fabricating semiconductor devices which asymmetrically forms contours of a microwave in a process chamber while a polymer film on a semiconductor substrate is hardened.

Example embodiments of the inventive concepts further provide an apparatus for fabricating semiconductor devices which prevents an arc of a microwave in a process chamber while a polymer film on a semiconductor substrate is hardened.

Example embodiments of the inventive concepts further provide an apparatus for fabricating semiconductor devices which uniformly transmits energy of a microwave on a whole surface of a semiconductor substrate in a process chamber while a polymer film on the semiconductor substrate is hardened.

Example embodiments of the inventive concepts further still provide an apparatus for fabricating semiconductor devices which precisely detects a temperature of a semiconductor substrate and a polymer film in a process chamber while the polymer film on the semiconductor substrate is hardened.

Other embodiments of the inventive concepts are not limited to the foregoing embodiments.

In accordance with one aspect of the inventive concepts, an apparatus for fabricating semiconductor devices may comprise a chamber. The chamber may have a bottom plane, a side wall and a lid. An irradiating unit may be at an interior of the chamber. A substrate mounting unit may be between the bottom plane of the chamber and the irradiating unit. The irradiating unit may comprise an irradiating tube and a hole penetrating a central region of the irradiating tube. The irradiating tube may have a hollow disk shape, and a lower surface of the irradiating tube may be open to the substrate mounting unit.

In one example embodiment, the bottom plane may be in a shape of an asymmetric polygon, and the side wall may include a plurality of surfaces corresponding respectively to a plurality of sides of the asymmetric polygon.

In one example embodiment, the irradiating tube may include a partition separating an inner space of the irradiating tube.

In one example embodiment, the apparatus for fabricating semiconductor devices may further comprise a supply unit exterior to the chamber. The supply unit may include a first wave guiding tube, an absorbing tube and a microwave machine. The first wave guiding tube may have one end communicating with the irradiating unit and the other end extending from the side wall of the chamber to a position exterior to the chamber.

In one example embodiment, the other end of the first wave guiding tube may include a first passageway connected to the absorbing tube, and a second passageway connected to the microwave machine.

In one example embodiment, the apparatus for fabricating semiconductor devices may further comprise an absorbing unit at a position exterior to the chamber. The absorbing unit may communicate with the interior of the chamber through the side wall of the chamber.

In one example embodiment, the irradiating unit may further include an irradiation guiding member, and the irradiation guiding member may include a plurality of slits. The lower surface of the irradiating tube may be covered with the irradiation guiding member.

In one example embodiment, the plurality of slits may be formed as at least one of concentric circles and in a spiral shape.

In one example embodiment, the substrate mounting unit may include a process chuck having a central region and a peripheral region, and the central region and the peripheral region may have a step difference with respect to each other.

In one example embodiment, the process chuck may include metal.

In one example embodiment, the apparatus for fabricating semiconductor devices may further comprise a rotation unit under the substrate mounting unit. The rotation unit may revolve and rotate the process chuck.

In one example embodiment, the apparatus for fabricating semiconductor devices may further comprise a heat sensing part on the lid of the chamber.

In one example embodiment, the apparatus for fabricating semiconductor devices may further comprise a protection tube aligning with the heat sensing part under the lid of the chamber. The protection tube may penetrate the irradiating tube through the hole of the irradiating tube. The heat sensing part may face the substrate mounting unit through the protection tube.

In one example embodiment, the irradiating unit may include a second wave guiding tube communicating with the supply unit through the side wall of the chamber.

In accordance with another aspect of the inventive concepts, an apparatus for fabricating semiconductor devices may comprise a chamber. The chamber may include a bottom plane and a lid shaped as an asymmetric polygon, and a side wall having a same number of surfaces as sides of the polygon. An irradiating unit may be at a central region of an interior of the chamber. A process chuck may be between the bottom plane of the chamber and the irradiating unit. The irradiating unit may include a hollow ring on the process chuck. One end of the irradiating unit may be closed. The other end of the irradiating unit may be fixed to the side wall of the chamber.

In accordance with another aspect of the inventive concepts, an apparatus for fabricating semiconductor devices may comprise a partially enclosed chamber. An irradiating unit may be at an interior of the chamber and may have a hollow disk shape. A substrate mounting unit may be between a bottom of the chamber and the irradiating unit. The apparatus may further include a rotation unit. A portion of the rotation unit may be between the substrate mounting unit and the bottom of the chamber. The rotation unit may revolve and rotate the substrate mounting unit.

In one example embodiment, the chamber may include a bottom plane a side wall and a lid. The bottom plane may be in a shape of an asymmetric polygon, and the side wall may include a plurality of surfaces corresponding respectively to a plurality of sides of the asymmetric polygon.

In one example embodiment, the apparatus for fabricating semiconductor devices may further include a heat sensing part on a lid of the chamber.

In one example embodiment, the apparatus for fabricating semiconductor devices may further comprise a protection tube aligning with the heat sensing part under the lid of the chamber. The irradiating unit may comprise an irradiating tube and a hole penetrating a central region of the irradiating tube. The protection tube may penetrate the irradiating tube through the hole of the irradiating tube. The heat sensing part may face the substrate mounting unit through the protection tube.

In one example embodiment, the irradiating unit may further comprise and irradiating tube and an irradiation guiding member. The irradiation guiding member may comprise a plurality of slits and the lower surface of the irradiating tube may be covered with the irradiation guiding member.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENT

Figure 1A:
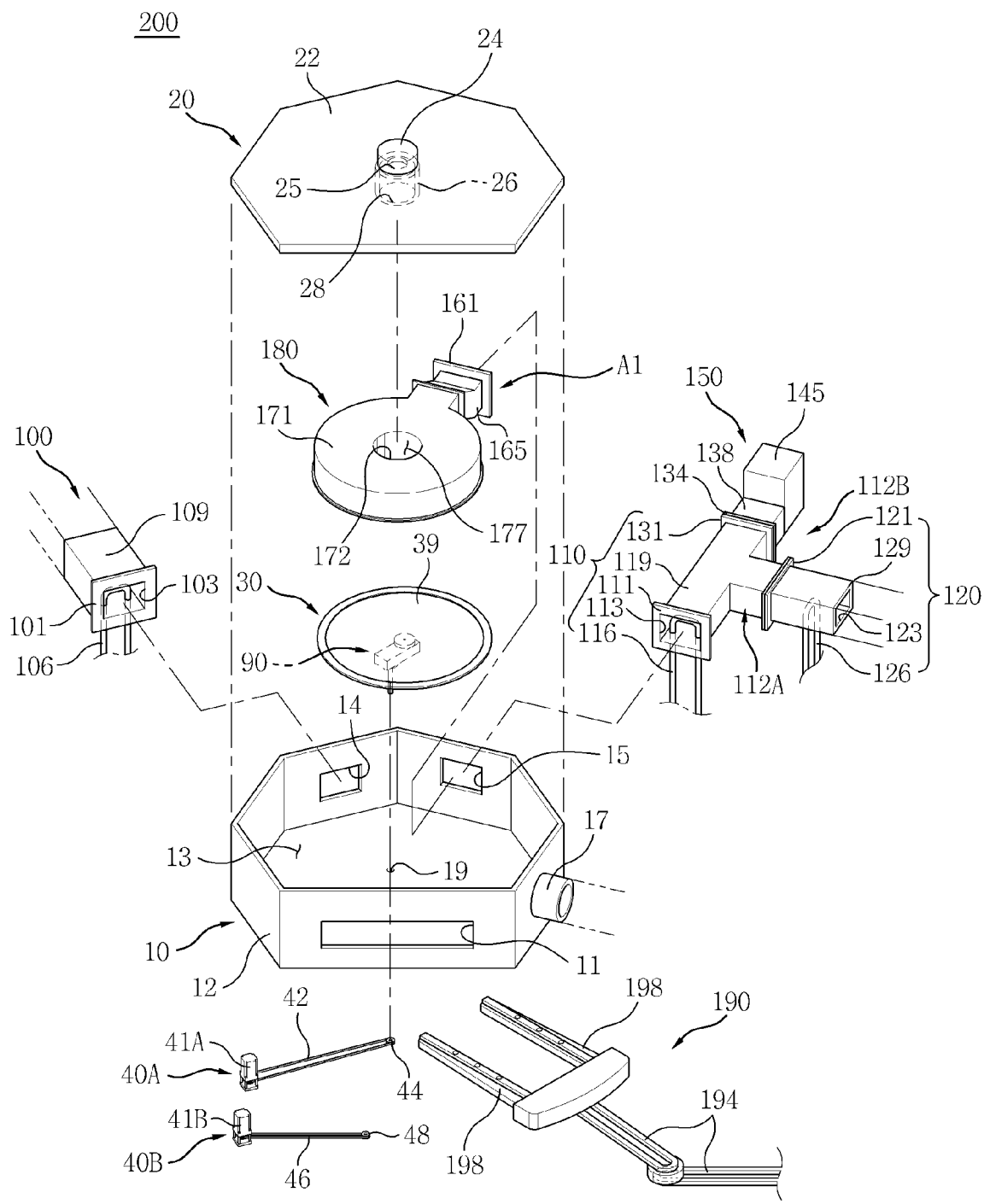
FIGS. 1A and 1B are exploded schematic perspective views illustrating an apparatus for fabricating semiconductor devices according to example embodiments of the inventive concepts.

Various exemplary embodiments will be described more fully hereinafter with reference to the accompanying drawings in which some exemplary embodiments are shown. The present inventive concept may, however, be embodied in many different forms and should not be construed as limited to the exemplary embodiments set forth herein.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

It will be understood that when an element or layer is referred to as being "on," "connected to" or "coupled to" another element or layer, it can be directly on, connected to, or coupled to, the other element or layer, or intervening elements or layers may be present. In contrast, when an element or layer is referred to as being "directly on," "directly connected to" or "directly coupled to" another element or layer, there are no intervening elements or layers present.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in the specification, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees at other orientations) and the spatially relative descriptors used herein interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. The regions illustrated in the figures are schematic in nature and their shapes are not intended to illustrate the actual shape of a region of a device and are not intended to limit the scope.

It should also be noted that in some alternative implementations, the functions/acts noted may occur out of the order noted in the figures. For example, two figures shown in succession may in fact be executed substantially concurrently, or may sometimes be executed in the reverse order, depending upon the functionality/acts involved.

In order to more specifically describe example embodiments, various aspects will be described in detail with reference to the attached drawings. However, the present invention is not limited to example embodiments described.

Now, an apparatus for fabricating semiconductor devices according to example embodiments of the inventive concepts will be described in further detail by referring to FIGS. 1 to 7.

A microwave cure hardens a polymer film on a semiconductor substrate in a shorter time as compared with a thermal cure and is performed at a lower temperature than the thermal cure. However, the microwave cure is not applied to a semiconductor product line due to issues in hardening the polymer film. One issue with using the microwave cure, is an occurrence of a plasma arc on the semiconductor substrate caused by a reaction between metallic material located on the semiconductor substrate and the microwave irradiated on the semiconductor substrate.

Another issue with using the microwave cure, is unequal heating of a surface of the semiconductor substrate. The unequal heating is caused by a phenomenon of the microwave to crowd an edge of the semiconductor substrate. Another issue with using the microwave cure is that is difficult to vary a mode of an electromagnetic field and difficult to detect and control a temperature of the surface of the semiconductor substrate in a microwave chamber.

Another issue with using the microwave cure is that it is difficult to perform a wafer batch process needed for mass production which is due to the difficulty in inserting the microwave between two adjacent semiconductor substrates due to a greater wavelength of the microwave in size than a distance between the two adjacent semiconductor substrates and the difficulty of uniformly controlling temperatures of surfaces of a plurality of semiconductor substrates in the microwave chamber.

Another issue with using the microwave cure is a low efficiency due to an energy loss of the microwave and usage of an expensive microwave power control module.

Accordingly, the present inventive concept provides an ultra thin microwave chamber which overcomes the above issues of using the microwave cure and a process or using the same.

FIG. 1A is an exploded schematic perspective view illustrating an apparatus for fabricating semiconductor devices according to example embodiments of the inventive concepts.

Referring to FIG. 1A, an apparatus 200 for fabricating semiconductor devices according to example embodiments of the inventive concepts may include a chamber body 10. The chamber body 10 may comprise stainless steel. The chamber body 10 may include a side wall 12 and a bottom plane 13. The side wall 12 may vertically extend from the bottom plane 13 along an edge of the bottom plane 13.

The side wall 12 and the bottom plane 13 may confine and form outer walls of the chamber body 10. The bottom plane 13 may be in a shape of a polygon. In the example embodiment in which the bottom plane 13 is in the shape of a polygon, the edge of the bottom plane 13 may be formed so that a side of the edge is asymmetric with respect to the other sides of the edge. In more detail, when the bottom plane 13 is in the shape of the polygon, the edge of the bottom plane 13 may include a first side corresponding to a diameter of a semicircle, and a plurality of second sides corresponding to a circumference of the semicircle.

Also, the edge of the bottom plane 13 may include a first side and a plurality of second sides, each of which may have a length relatively shorter than the first side. In this example embodiment, the plurality of second sides may have the same length with respect to each other. As such, the bottom plane 13 may be in a shape of an asymmetric polygon. For example, the bottom plane 13 may include seven sides of a heptagon. In FIG. 1A, the bottom plane 13 is a heptagon having one first side and six second sides each of which having a length relatively shorter than the one first side. The bottom plane 13 may have a shape in which one vertex between two adjacent sides of an octagon is skipped.

Alternatively, the bottom plane 13 may be in a shape of a semicircle or an oval. The bottom plane 13 may include a first connection hole 19. The side wall 12 may include a plurality of quadrangular surfaces along the edge of the bottom plane 13. The side wall 12 may include a substrate gate 11, at least one first through window 14, a second through window 15 and an exhaust port 17 in portions of the quadrangular surfaces thereof.

The substrate gate 11, the at least one first through window 14, the second through window 15 and the exhaust port 17 may be disposed in different surfaces from each other on the side wall 12. In an alternative embodiment, at least two of the first through window 14, the second through window 15 and the exhaust port 17 may be disposed in the same surfaces as each other on the side wall 12. A height of the side wall 12 may be determined by considering a height of a housing 210, and a stack structure of process chambers 241, 243, 245, 247, 249, 261, 263, 265, 267, 269 in FIGS. 7 and 8. In one example embodiment, the height of the side wall 12, for example, may be between 10 cm and 15 cm. However, the height of the side wall 12 may be less than 10 cm, or greater than 15 cm.

The apparatus 200 may include a chamber lid 20 on the chamber body 10. The chamber lid 20 may include a ceiling 22, a heat sensing part 24 and a first protection tube 26. The ceiling 22 may be disposed on the side wall 12 of the chamber body 10 and may face the bottom plane 13 of the chamber body 10. The ceiling 22 may include a through hole 25.

The heat sensing part 24 may be disposed on an upper surface of the ceiling 22. The heat sensing part 24 may include an infrared sensor. The heat sensing part 24 may be aligned with the through hole 25 of the ceiling 22 and may be disposed on the through hole 25. Alternatively, the heat sensing part 24 may be disposed in the through hole 25 of the ceiling 22. In this example embodiment, the heat sensing part 24 may be disposed in the first protection tube 26 through the through hole 25 of the ceiling 22.

The first protection tube 26 may be disposed under a lower surface of the ceiling 22 and may be extended downwardly from the lower surface of the ceiling 22. The first protection tube 26 may be aligned with the through hole 25 of the ceiling 22. A diameter of a first monitoring window 28 of the first protection tube 26 may be smaller than a wavelength of the microwave corresponding to a frequency of 2.45 GHz. For example, the diameter of the first monitoring window 28 may have a value between 5 mm and 30 mm.

However, the diameter of the first monitoring window 28 may be greater than about 30 mm depending on a wavelength of a microwave corresponding to a frequency of less than 2.45 GHz. The ceiling 22 and the first protection tube 26 may comprise stainless steel. A substrate mounting unit 30 and a rotation unit 90 may be disposed between the chamber body 10 and the chamber lid 20. The substrate mounting unit 30 may be located on the rotation unit 90.

Figure 2:
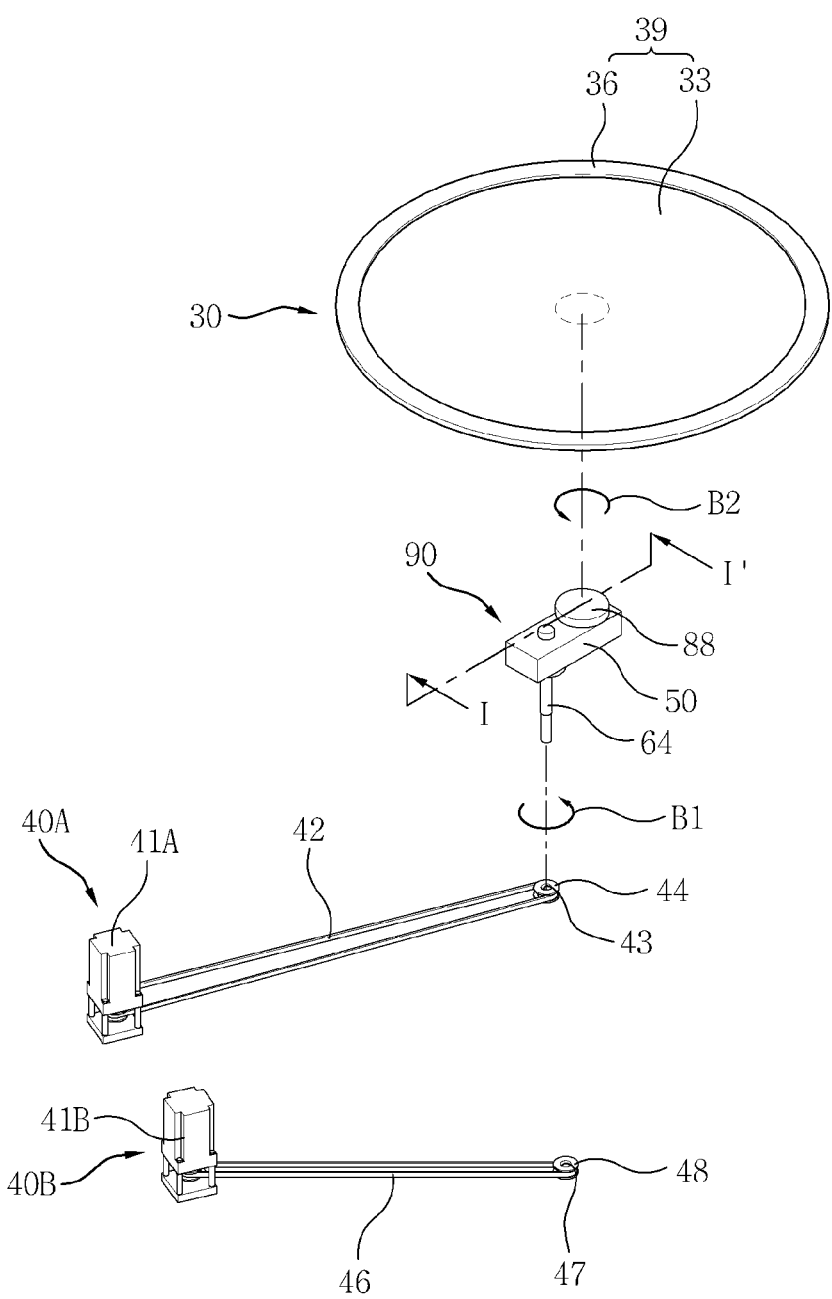
FIG. 2 is an exploded schematic perspective view illustrating a substrate mounting unit, a rotation unit and a driving unit according to example embodiments of the inventive concepts.

The substrate mounting unit 30 may include a process chuck 39. The process chuck 39 may have a step difference between a central region of the process chuck 39 and a peripheral region of the process chuck 39 as illustrated in FIG. 2. The process chuck 39 may comprise stainless steel. The rotation unit 90 may be inserted into the first connection hole 19 located in the bottom plane 13 of the chamber body 10.

First and second driving units 40A, 40B may be disposed under the chamber body 10. The first and second driving units 40A and 40B may be simultaneously operated by the apparatus 200 for fabricating semiconductor devices, or may be independently operated with respect to each other by the apparatus 200 for fabricating semiconductor devices. The first driving unit 40A may include a first driving part 41A, a first driving member 42, and a first body of rotation 44. The second driving unit 40B may include a second driving part 41B, a second driving member 46, and a second body of rotation 48.

The first and second driving parts 41A and 41B may include an electric motor. The first driving part 41A may rotate the first driving member 42 and the first body of rotation 44. The second driving part 41B may rotate the second driving member 46 and the second body of rotation 48. The first driving member 42 and the second driving member 46 may include a belt. The first body of rotation 44 and the second body of rotation 48 may comprise stainless steel.

The first body of rotation 44 may be combined with the rotation unit 90 through the bottom plane 13 of the chamber body 10. The first and second driving units 40A and 40B and the rotation unit 90 will be described in more detail in connection with FIGS. 2 and 3.

At least one absorbing unit 100 may be aligned with the at least one first through window 14 of the chamber body 10. The at least one absorbing unit 100 may include a first connecting member 101, a first fluid tube 106 and a first absorbing tube 109.

The first connecting member 101 may surround a first gate 103 in one end of the first absorbing tube 109. The first connecting member 101 may align the first gate 103 with the at least one first through window 14 and may be fixed to the side wall 12 of the chamber body 10. The at least one absorbing unit 100 may have a function of absorbing and/or discharging a microwave from the interior of the chamber body 10.

An opening area of the first gate 103 may be the same size as or, alternatively, a different size from an opening area of the at least one first through window 14. The first fluid tube 106 may penetrate the first absorbing tube 109 and may be disposed as a reversed letter 'U' in the interior and the exterior of the first absorbing tube 109. The first fluid tube 106 may comprise quartz. The other end of the first absorbing tube 109 may extend from the first connecting member 101 in a direction away from the chamber body 10. The first connecting member 101 and the first absorbing tube 109 may comprise stainless steel.

A wave guiding unit 150 may be aligned with the second through window 15 of the chamber body 10. The wave guiding unit 150 may include a wave guiding part 110, an absorbing part 120 and a microwave machine 145. The wave guiding part 110 may include a second left connecting member 111, a second right connecting member 131, a second fluid tube 116, and a first wave guiding tube 119.

The second left connecting member 111 may surround a second gate 113 in one end of the first wave guiding tube 119. The second left connecting member 111 may align the second gate 113 with the second through window 15 of the chamber body 10 and may be fixed to the side wall 12 of the chamber body 10. An opening area of the second gate 113 may be the same size as or, alternatively, a different size from an opening area of the second through window 15.

The second fluid tube 116 may penetrate the first wave guiding tube 119 and may be disposed as a reversed letter 'U' in the interior and the exterior of the first wave guiding tube 119. The second fluid tube 116 may include the same material as the first fluid tube 106, for example, quartz. The other end of the first wave guiding tube 119 may extend from the second left connecting member 111 in a direction away from the chamber body 10 and diverge into first and second passageways 112A and 112B. The first wave guiding tube 119 may communicate with the absorbing part 120 through the first passageway 112A.

The absorbing part 120 may include a third connecting member 121, a third fluid tube 126 and a second absorbing tube 129. The first wave guiding tube 119 and the second absorbing tube 129 may be exposed or coupled to each other through the first passageway 112A and a third gate 123. The third fluid tube 126 may penetrate the second absorbing tube 129 and may be disposed as a reversed letter 'U' in the interior and the exterior of the second absorbing tube 129. The third fluid tube 126 may include the same material as the first fluid tube 106, for example, quartz.

The first wave guiding tube 119 may communicate with a second wave guiding tube 138 through the second passageway 112B. One end of the second wave guiding tube 138 may couple the second right connecting member 131 of the wave guiding part 110 and a fourth connecting member 134 of the second wave guiding tube 138, and may communicate with the first wave guiding tube 119. The other end of the second wave guiding tube 138 may be connected to the microwave machine 145.

The microwave machine 145 may generate a microwave and transmit the microwave to the wave guiding part 110. The microwave may include all industrial frequencies. Except for the second and third fluid tubes 116 and 126, the remaining elements of the wave guiding unit 150 may comprise stainless steel. An irradiating unit 180 may be disposed between the chamber lid 20 and the substrate mounting unit 30.

The irradiating unit 180 may include a fifth connecting member 161, a third wave guiding tube 165 and an irradiating tube 171. The fifth connecting member 161 may surround a fourth gate 163 of the third wave guiding tube 165 as illustrated in an enlarged view of section A1 in FIG. 1B. The fifth connecting member 161 may align the fourth gate 163 with the second through window 15 of the chamber body 10 and may be fixed to an interior of the side wall 12 of the chamber body 10.

The irradiating tube 171 may be located in an interior central region of the chamber body 10. The irradiating tube 171 may be shaped like a hollow cylinder or ring or have a hollow disk shape, and the interior of the irradiating tube 171 may be exposed or opened to the bottom plane 13 of the chamber body 10. For example, a lower surface of the irradiating tube 171 may be opened. The irradiating tube 171 may include a second protection tube 177 in a central region of the irradiating tube 171.

The second protection tube 177 may be extended from an upper portion of the irradiating tube 171 toward the interior of the irradiating tube 171. The second protection tube 177 may be aligned with the first protection tube 26 and may surround the first protection tube 26 of the chamber lid 20. In this example embodiment, the first protection tube 26 may be located in the interior of the second protection tube 177. The first monitoring window 28 of the first protection tube 26, and a second monitoring window 172 of the second protection tube 177 may expose the heat sensing part 24 of the ceiling 22 to the process chuck 39.

The irradiating unit 180 will be described in more detail in connection with FIGS. 4A to 4C. A substrate transferring unit 190 may be disposed adjacent to the chamber body 10. The substrate transferring unit 190 may include a supporter 194 and arms 198. The supporter 194 may help the arms 198 move easily therein. The arms 198 may grasp or pick up a semiconductor substrate. The supporter 194 and the arms 198 may comprise stainless steel.

FIG. 2 is an exploded schematic perspective view showing the substrate mounting unit 30, the rotation unit 90 and the driving units 40A and 40B of FIG. 1A.

Referring to FIG. 2, the substrate mounting unit 30, according to example embodiments of the inventive concepts, may include the process chuck 39. The process chuck 39 may include a mount panel 33 and a guider 36. Top surfaces of the mount panel 33 and the guider 36 may be respectively located in different levels from each other. A semiconductor substrate may be mounted on the mount panel 33. The guider 36 may prevent the semiconductor substrate mounted on the mount panel 33 from separating from the process chuck 39.

The process chuck 39 may be formed of a material which transmits microwave energy well. In this example embodiment, the material of the process chuck 39 may be metal, for example, stainless steel. The rotation unit 90 may be disposed under the substrate mounting unit 30. The rotation unit 90 may include a rotation housing 50, an axis of rotation 64 and a rotation transferring member 88.

The rotation housing 50 may be fixed to the axis of rotation 64. The rotation transferring member 88 may protrude from the rotation housing 50 and may be fixed to a central region of the process chuck 39. The rotation transferring member 88 may move with respect to the axis of rotation 64. The rotation unit 90 will be described in more detail in connection with FIG. 3.

The first and second driving units 40A and 40B may be disposed under the rotation unit 90. The first driving unit 40A may include the first driving part 41A, the first driving member 42 and the first body of rotation 44. The second driving unit 40B may include the second driving part 41B, the second driving member 46 and the second body of rotation 48. The first body of rotation 44 may be coupled with the axis of rotation 64 of the rotation unit 90 through a second connection hole 43 of the first driving unit 40A.

The first driving part 41A may cause the rotation housing 50, the axis of rotation 64 and the rotation transferring member 88 to produce a first rotary motion in a first direction B1 through the first driving member 42 and the first body of rotation 44. Also, the axis of rotation 64 may cause the rotation transferring unit 88 to produce a second rotary motion in a second direction B2 through the rotation housing 50.

In this embodiment, the process chuck 39 may revolve around the first connection hole 19 located in the bottom plane 13 of the chamber body 10 of FIG. 1A, through the first rotary motion of the rotation unit 90. The process chuck 39 may rotate around the first connection hole 19 located in the bottom plane 13 of the chamber body 10 of FIG. 1A, through the second rotary motion of the rotation unit 90.

Figure 6A:
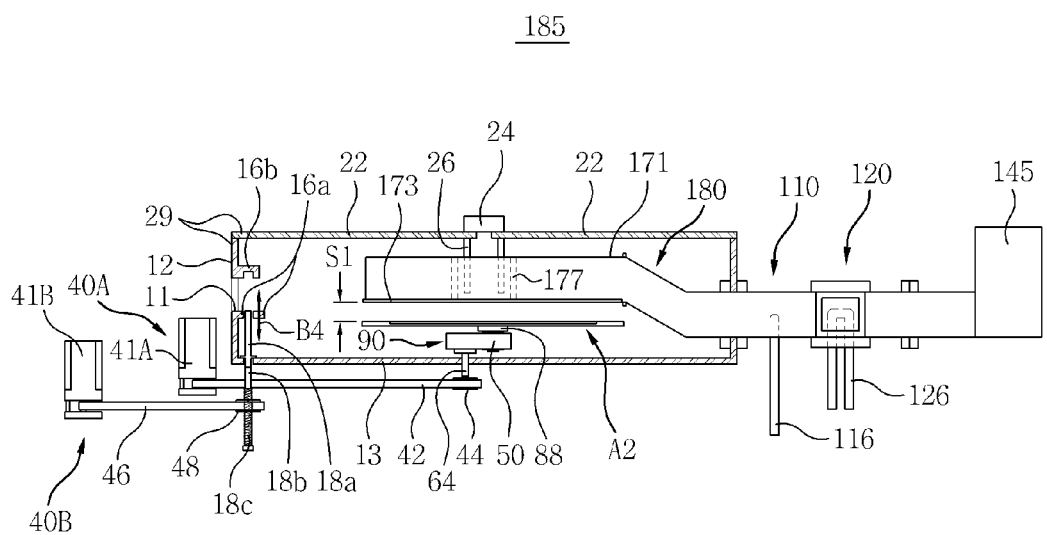
FIGS. 6A and 6B are schematic cross-sectional views illustrating a process performing unit in a B3 direction of FIG. 5.

The second body of rotation 48 may be coupled with a pusher 18b of FIG. 6A through a third connection hole 47 of the second driving unit 40B. An operational relationship between the pusher 18b and the second driving part 41B will be described in more detail in connection with FIG. 6A.

Figure 3:
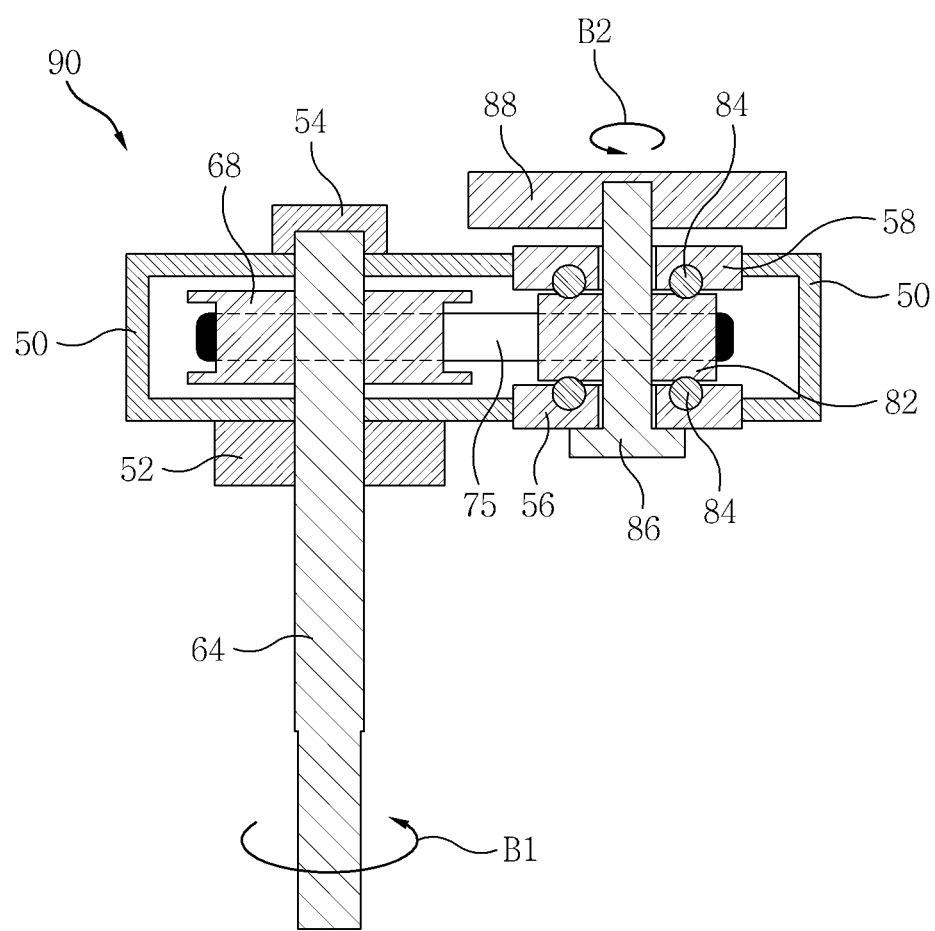
FIG. 3 is a schematic cross-sectional view illustrating a rotation unit taken along line I-I' of FIG. 2.

FIG. 3 is a schematic cross-sectional view illustrating the rotation unit 90 taken along line I-I' of FIG. 2.

Referring to FIG. 3, the rotation unit 90 may include a lower fixation member 52, an upper fixation member 54 and the rotation transferring member 88 exterior to the rotation housing 50. The rotation unit 90 may include first to fourth rotation assisting members 68, 75, 82 and 84 in the interior of the rotation housing 50. The rotation unit 90 may include first and second axes of rotation 64 and 86 penetrating the rotation housing 50.

The first axis of rotation 64 may be exposed to the exterior of the chamber body 10 through the first connection hole 19 located in the bottom plane 13 of the chamber body 10 in FIG. 1A. That is, the first axis of rotation 64 extends through the first connection hole 19 to a position exterior to the chamber body 10. The first axis of rotation 64 may make a first rotary motion in a first direction B1 through the first driving part 41A as illustrated in FIG. 2. The first axis of rotation 64 may be fixed to the rotation housing 50 through the lower fixation member 52 and the upper fixation member 54.

The second rotation assisting member 75 may be connected to the first and third rotation assisting members 68 and 82. The second rotation assisting member 75 may comprise a belt. The third rotation assisting member 82 may be fixed to the second axis of rotation 86. The third rotation assisting member 82 may contact the fourth rotation assisting member 84 between a lower guide member 56 and an upper guide member 58.

The fourth rotation assisting member 84 may comprise a bearing. In this embodiment, the second axis of rotation 86 may receive rotary power of the first axis of rotation 64 from the second rotation assisting member 75 to make a second rotary motion in a second direction B2. As such, the third rotation assisting member 82 and the second axis of rotation 86 may be rotated with respect to the rotation housing 50. The second axis of rotation 86 may be fixed to the rotation transferring member 88 in an upper portion of the rotation housing 50.

FIGS. 4A to 4D are schematic perspective views illustrating the irradiating unit 180 of FIG. 1A.

Figure 4A:
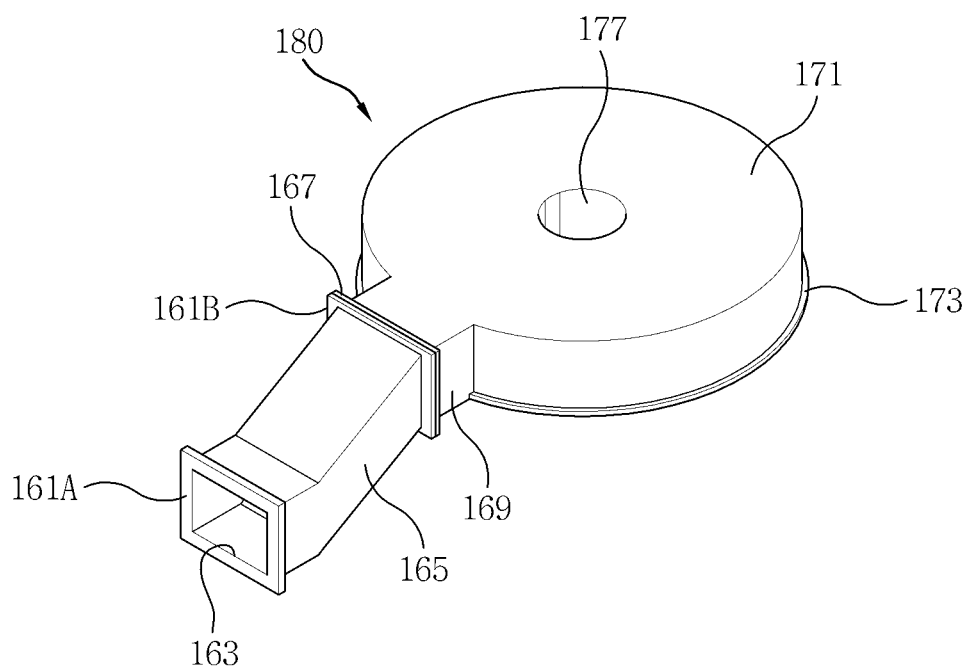
FIGS. 4A to 4D are schematic perspective views illustrating an irradiating unit of FIG. 1A.

Referring to FIG. 4A, the irradiating unit 180 may include fifth left connecting member 161A, fifth right connecting member 161B and sixth connecting member 167, third and fourth wave guiding tubes 165 and 169, the irradiating tube 171 and an irradiation guiding member 173. The fifth left connecting member 161A may surround third gates 163 of the third wave guiding tube 165. The third gates 163 may be shaped like a quadrangular opening. The third wave guiding tube 165 may be sloped so as to make a space for movement of the substrate transferring unit 190 between the process chuck 39 and the irradiating tube 171 in FIG. 1A.

One end of the third wave guiding tube 165 may be fixed to the side wall 12 of the chamber body 10 of FIG. 1A through the fifth left connecting member 161A. The other end of the third wave guiding tube 165 may be fixed to the sixth connecting member 167 of the fourth wave guiding tube 169 through the fifth right connecting member 161B. The third and fourth wave guiding tubes 165 and 169 may communicate with each other through the fifth left connecting member 161A, the fifth right connecting member 161B and the sixth connecting member 167.

Each of the third and fourth wave guiding tubes 165 and 169 may be shaped like a hollow tube. For example, each of the third and fourth wave guiding tubes 165 and 169 may have, in a cross-sectional view, a quadrangular opening. The fourth wave guiding tube 169 may be formed to be one with the irradiating tube 171. The irradiating tube 171 may include the second protection tube 177. The second protection tube 177 may surround the first protection tube 26 within the chamber lid 20 in FIG. 1A. The irradiation guiding member 173 may be disposed under the irradiating tube 171.

Figure 4B:
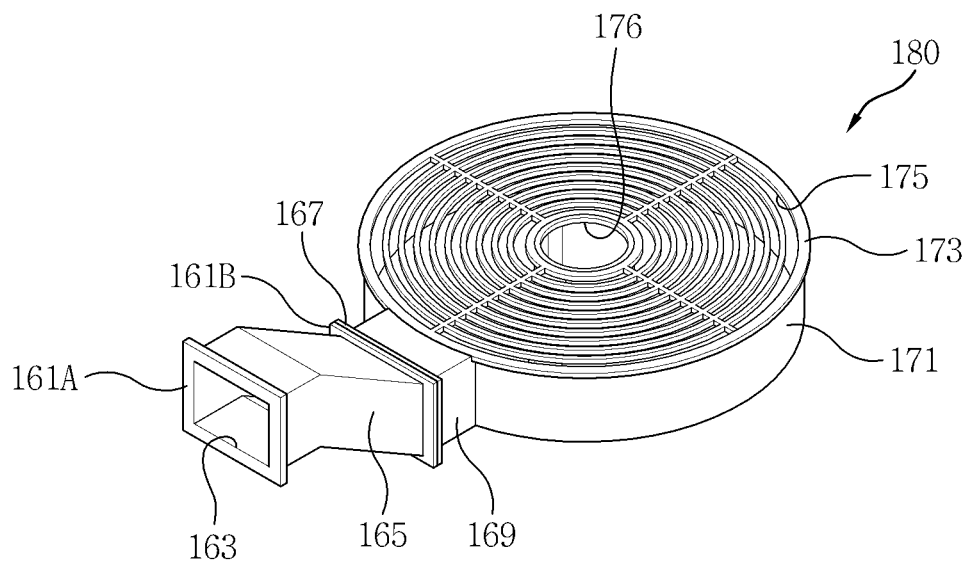

Referring to FIG. 4B, the irradiation guiding member 173 may be shaped like a ring. The irradiation guiding member 173 may include a third monitoring window 176 in a central region thereof. The third monitoring window 176 may be aligned with the second protection tube 177 in FIG. 4A. The irradiation guiding member 173 may be fixed to the irradiating tube 171 through a peripheral region thereof. The irradiation guiding member 173 may include a plurality of slits 175 between the central and peripheral regions thereof.

The slits 175 may, alternatively, have a variety of names or shapes, such as a grid, a grating, a grill or the like. According to example embodiments of the inventive concepts, the slits 175 may be formed in the irradiation guiding member 173 to have concentric circles or a spiral shape along an edge of the irradiation guiding member 173.

Figure 4C:
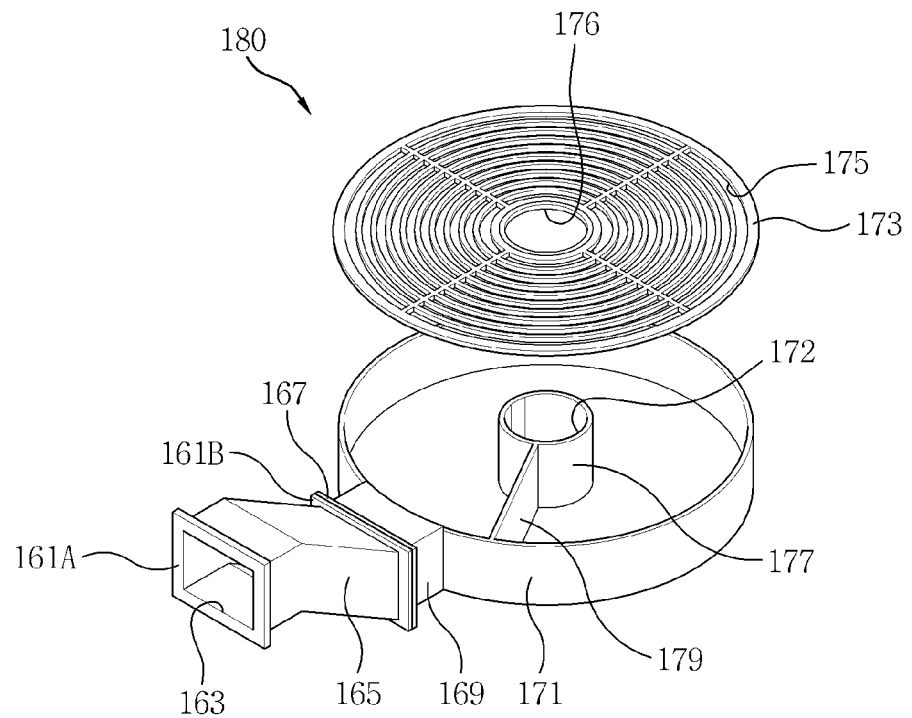

Referring to FIG. 4C, it may be understood that, in one example embodiment, the irradiating tube 171 is shaped like a hollow cylinder, and a lower surface of the irradiating tube 171 is opened. In more detail, the interior of the irradiating tube 171 may be exposed or opened to the bottom plane 13 of the chamber body 10 of FIG. 1A through the irradiation guiding member 173. The irradiating tube 171 may include a partition 179 separating an inner space in the irradiating tube 171.

A side wall of the second protection tube 177 may have the same shape as a side wall of the irradiating tube 171. The partition 179 of the irradiating tube 171 may be disposed between the side wall of the irradiating tube 171 and the side wall of the second protection tube 177. If a microwave is transmitted from the microwave machine 145 of FIG. 1A toward the irradiating unit 180, the partition 179 may block an incident wave circulating in the irradiating tube 171 from going back to the fourth wave guiding tube 169. As such, the partition 179 may reflect the microwave or may guide it under the irradiating tube 171 when being viewed in FIG. 1A.

The partition 179 may increase transmission efficiency of heat energy of the microwave under the irradiating tube 171. Most of the microwave may be transmitted to the process chuck 39 of FIG. 1A through the slits 175 of the irradiation guiding member 173, and the third monitoring window 176.

Figure 4D:
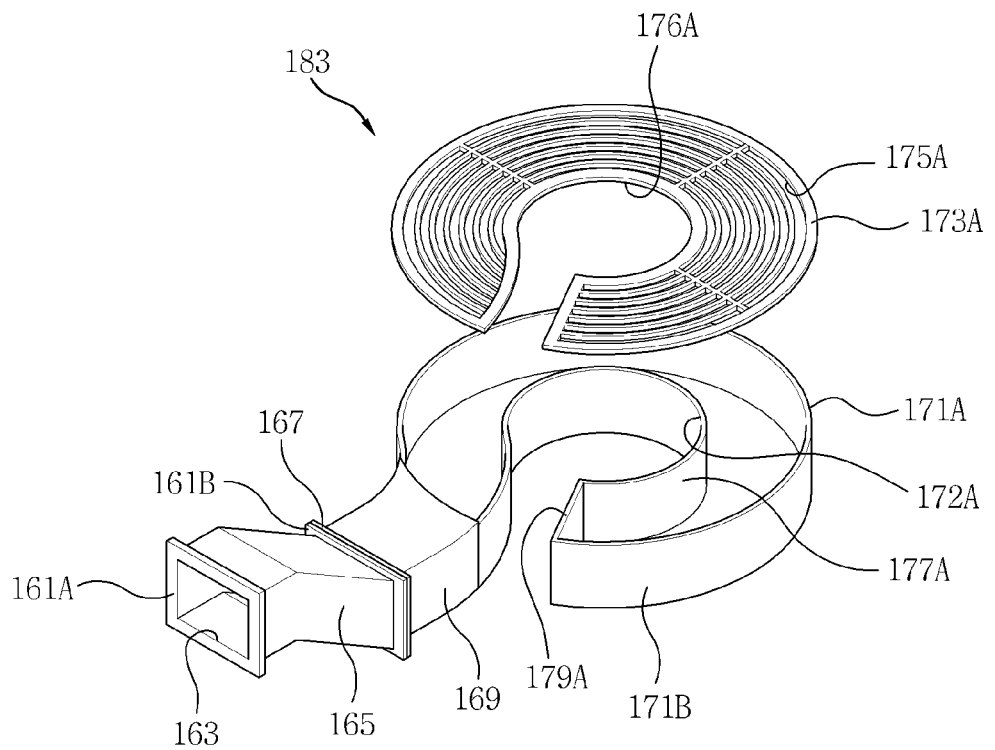

Referring to FIG. 4D, alternatively, the irradiating unit 180 may be modified as an applied irradiating unit 183 according to an alternative example embodiment of the inventive concepts. The applied irradiating unit 183 may include elements similar to the irradiating unit 180. In the example embodiment of FIG. 4D, the applied irradiating unit 183 may have an irradiating tube 171A, which is a half of a hollow tube shaped like a ring or a doughnut. One end of the irradiating tube 171A is closed. The irradiating tube 171A may be modified in a variety of shapes.

Although a side wall of the irradiating tube 171A may confine a quadrangular interior, it may define a circular, semicircular or polygonal interior. Also, a third wave guiding tube 165 of the applied irradiating unit 183 may be sloped. The irradiating tube 171A may confine an outer side wall 171B, an inner side wall 177A and a partition 179A. An irradiation guiding member 173A of the applied irradiating unit 183 may be fixed to the outer side wall 171B, the inner side wall 177A and the partition 179A, and may cover the interior of the irradiating tube 171A. The irradiation guiding member 173A may include a third monitoring window 176A in a central region thereof. The irradiation guiding member 173A may include a plurality of slits 175A between the central and peripheral regions thereof.

The irradiating tube 171A may be opened to the third wave guiding tube 165 and a fourth wave guiding tube 169, and may have a second monitoring window 172A confined by the inner side wall 177A.

Figure 1B:
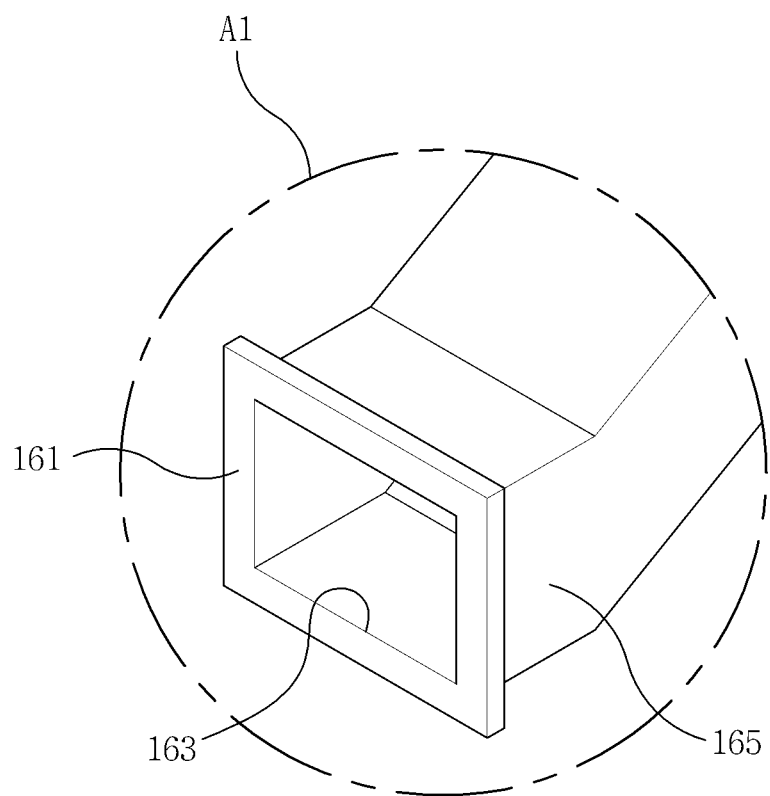
Figure 5:
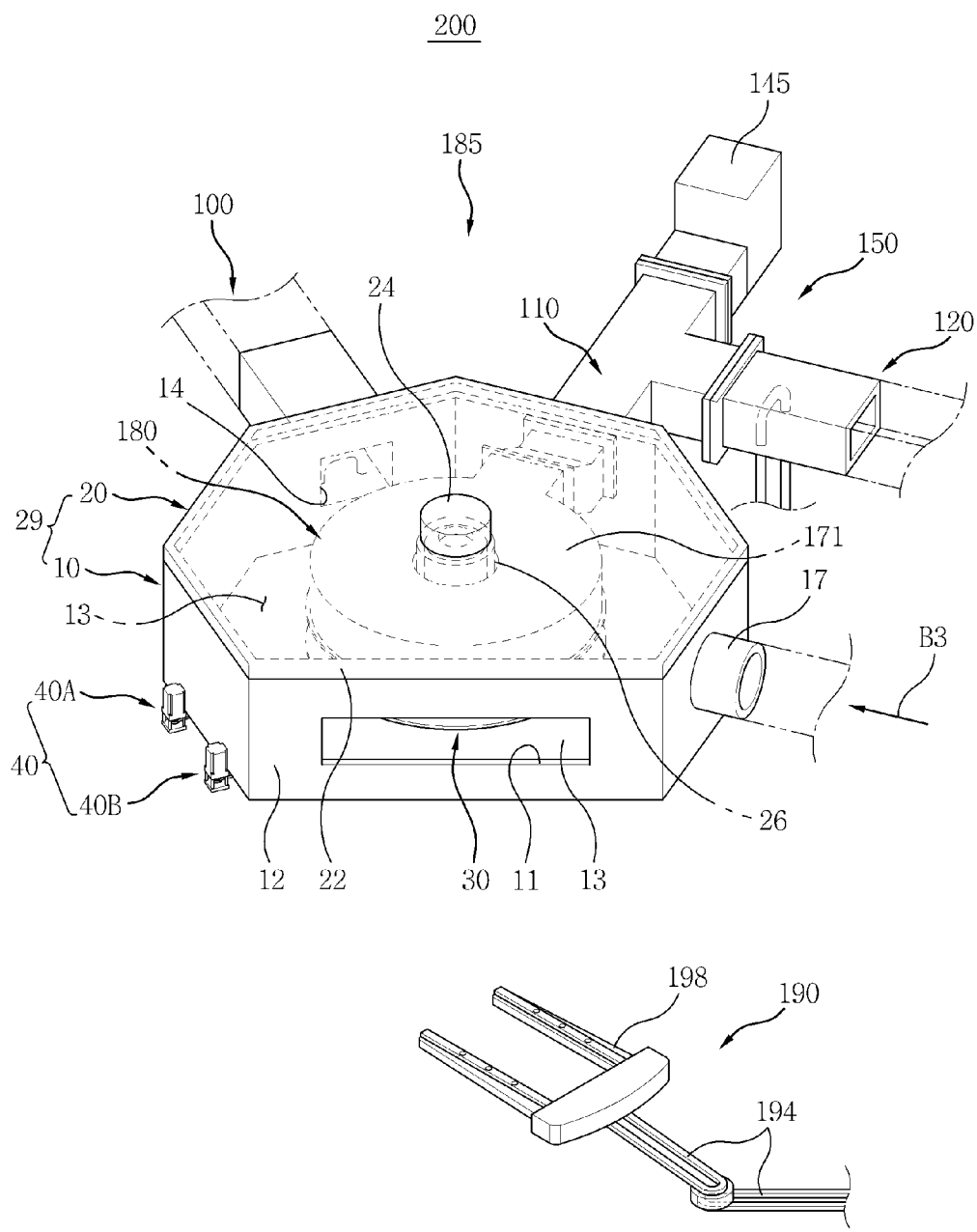
FIG. 5 is a schematic perspective view illustrating an apparatus for fabricating semiconductor devices of FIG. 1A.

FIG. 5 is a schematic perspective view illustrating the apparatus for fabricating semiconductor devices 200 of FIGS. 1A and 1B.

Referring to FIG. 5, the apparatus 200 for fabricating semiconductor devices according to example embodiments of the inventive concepts may include the process performing unit 185. The process performing unit 185 may include a process chamber 29, the substrate mounting unit 30, a driving unit 40 which includes first driving unit 40A and second driving unit 40B, the at least one absorbing unit 100, the wave guiding unit 150 and the irradiating unit 180. The process chamber 29 may include the chamber body 10 and the chamber lid 20.

The chamber lid 20 may include the heat sensing part 24 on the top surface of the ceiling 22, and the first protection tube 26 on the bottom surface of the ceiling 22. The substrate mounting unit 30 may be located in the process chamber 29 and may be fixed to the rotation unit 90 of FIG. 3. The rotation unit 90 may be coupled with the first driving unit 40A through the first axis of rotation 64 of FIG. 3. The second driving unit 40B may be disposed under the process chamber 29.

The at least one absorbing unit 100 may be located exterior to the process chamber 29 and may be fixed or coupled to the side wall 12 of the process chamber 29. The at least one absorbing unit 100 may be aligned with the at least one through window 14 and may communicate with the process chamber 29.

The wave guiding unit 150 may be located exterior to the process chamber 29 and may be fixed or coupled to the side wall 12 of the process chamber 29.

The wave guiding unit 150 may be aligned with the second through window 15 of FIG. 1A and may communicate with the process chamber 29. The height of the side wall 12 of the process chamber 29 may be greater than that of a side wall of a microwave machine 145 in the wave guiding unit 150, when vertically viewed with respect to the bottom plane 13 of the process chamber 29.

The irradiating unit 180 may be located in the interior of the process chamber 29 and may be fixed or coupled to the side wall 12 of the process chamber 29.

The irradiating unit 180 may be aligned with the second through window 15 and may communicate with the wave guiding unit 150. The irradiating unit 180 may surround the first protection tube 26 in a central region of the irradiating unit 180. The substrate transferring unit 190 may be disposed adjacent to the process performing unit 185.

FIG. 6A is a schematic cross-sectional view illustrating the process performing unit 185 in a third direction B3 of FIG. 5.

Referring to FIG. 6A, the process performing unit 185 may include a door guide 16a, an alignment bar 16b and a door 18a, which are located adjacent to the substrate gate 11 when being viewed in a third direction B3 of FIG. 5. The door guide 16a and the alignment bar 16b may be extended from the side wall 12 of the process chamber 29 toward the interior of the process chamber 29. The door guide 16a and the alignment bar 16b may be respectively located in a lower portion and an upper portion of the substrate gate 11 and may be located along an edge of the substrate gate 11.

The door guide 16a and the alignment bar 16b may be located in both side portions of the substrate gate 11. The door guide 16a may separate the door 18a from the side wall 12 of the process chamber 29 and may help movement of the door 18a. The alignment bar 16b may limit movement distance of the door 18a and may help the opening and the closing of the substrate gate 11 by using the door 18a.

The door 18a may partially traverse a bottom plane 13 of the process chamber 29. An area of the door 18a may be larger than an opening area of the substrate gate 11. The pusher 18b may be disposed under the door 18a. The pusher 18b may be located in a central region of the substrate gate 11. The pusher 18b may include a screw 18c in a lower portion thereof.

The pusher 18b may be engaged with the second body of rotation 48 of the second driving unit 40B through the screw 18c exterior to the process chamber 29. In this example embodiment, the second driving part 41B of the second driving unit 40B may rotate the pusher 18b, the second driving member 46 and the second body of rotation 48, and may cause the door 18a to produce an up-and-down motion in a fourth direction B4. The door 18a may open and close the substrate gate 11 through the up-and-down motion of the pusher 18b.

The process performing unit 185 may partially expose the first axis of rotation 64 of the rotation unit 90, from the bottom plane 13 of the process chamber 29. The first axis of rotation 64 may be combined with the first body of rotation 44 of a driving unit 40A. The rotation housing 50 and the rotation transferring member 88 of the rotation unit 90 may be located in the interior of the process chamber 29. The rotation transferring member 88 may be fixed to the process chuck 39 of the substrate mounting unit 30.

Figure 6B:
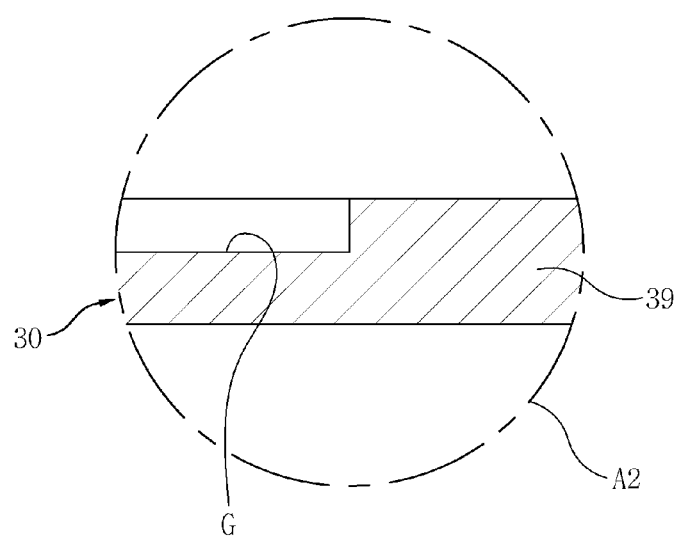

The process chuck 39 may have a groove G as shown in an enlarged view of section A2 in FIG. 6B. The groove G may be extended from a top surface of the process chuck 39 into the interior of the process chuck 39. The process performing unit 185 may expose the heat sensing part 24 to the process chuck 39 through the ceiling 22, the first protection tube 26, the irradiation guiding member 173 and the second protection tube 177. The process chuck 39 may be separated a predetermined distance Si from the irradiation guiding member 173.

The distance between the process chuck 39 and the irradiation guiding member 173 may be determined by considering the thickness of arms 198 in the substrate transferring unit 190, the thickness of a semiconductor substrate on the arms 198, and tolerance error of an up-and-down moving distance of the substrate transferring unit 190 under the irradiation guiding member 173. The distance between the process chuck 39 and the irradiation guiding member 173 may be, for example, between about 5 mm and about 50 mm.

Figure 7:
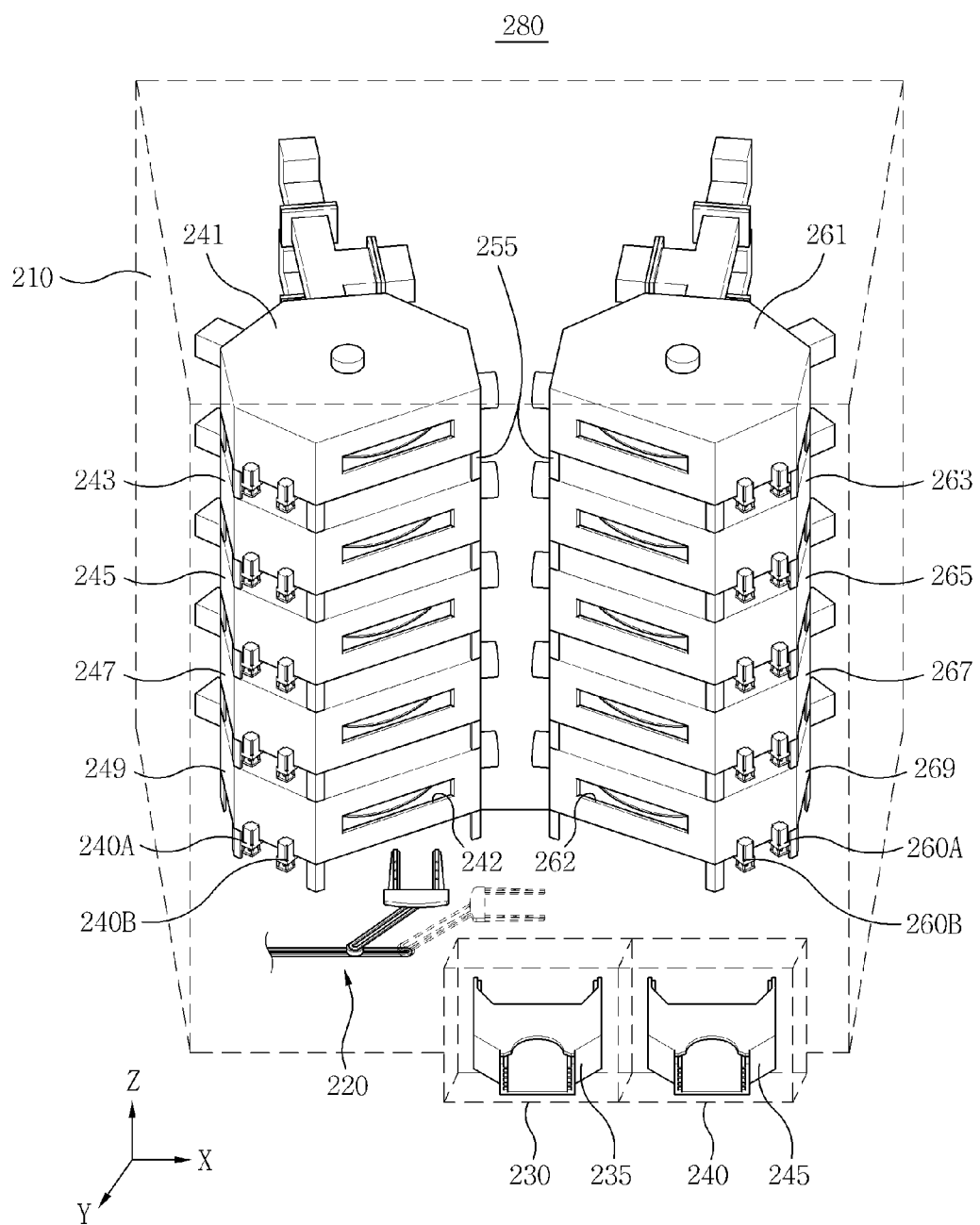
FIG. 7 is a schematic perspective view illustrating an apparatus for fabricating semiconductor devices according to example embodiments of the inventive concepts.

FIG. 7 is a schematic perspective view illustrating an apparatus for fabricating semiconductor devices according to example embodiments of the inventive concepts.

Referring to FIG. 7, an apparatus 280 for fabricating semiconductor devices according to example embodiments of the inventive concepts may include a housing 210. The housing 210 may include first and second process performing units 241, 243, 245, 247, 249, 261, 263, 265, 267 and 269. Each of the first and second process performing units 241, 243, 245, 247, 249, 261, 263, 265, 267 and 269 may have the same elements as the process performing unit 185 of FIG. 5.

In this example embodiment, the first process performing units 241, 243, 245, 247 and 249 may be located in a left side of the housing 210 and may have a stacked structure. The second process performing units 261, 263, 265, 267 and 269 may be located in a right side of the housing 210 and may have the same stacked structure as the first process performing units 241, 243, 245, 247 and 249. The first process performing units 241, 243, 245, 247 and 249 may be located on the same level as or a different level from the second process performing units 261, 263, 265, 267 and 269.

The first and second process performing units 241, 243, 245, 247, 249, 261, 263, 265, 267 and 269 may have substrate gates 242 and 262, respectively, facing each other. Pillars 255 may be disposed under the first and second process performing units 241, 243, 245, 247, 249, 261, 263, 265, 267 and 269. In more detail, the pillars 255 may help movement of first driving units 240A and 260A and second driving units 240B and 260B, between the first process performing units 241, 243, 245, 247, 249 and between the second process performing units 261, 263, 265, 267 and 269, and under the process performing units 249 and 269.

The apparatus 280 for fabricating semiconductor devices may further include a substrate transferring unit 220, a load chamber 230, and an unload chamber 240. The substrate transferring unit 220 may move between the first and second process performing units 241, 243, 245, 247, 249, 261, 263, 265, 267 and 269, the load chamber 230 and the unload chamber 240 along X, Y and Z directions. The substrate transferring unit 220 may provide a semiconductor substrate of a cassette 235 of the load chamber 230 to each of the first and second process performing units 241, 243, 245, 247, 249, 261, 263, 265, 267 and 269.

The substrate transferring unit 220 may separate the semiconductor substrate from the first and second respective process performing units 241, 243, 245, 247, 249, 261, 263, 265, 267 and 269, and may transfer the semiconductor substrate to a cassette 245 of the unload chamber 240.

Figure 8:
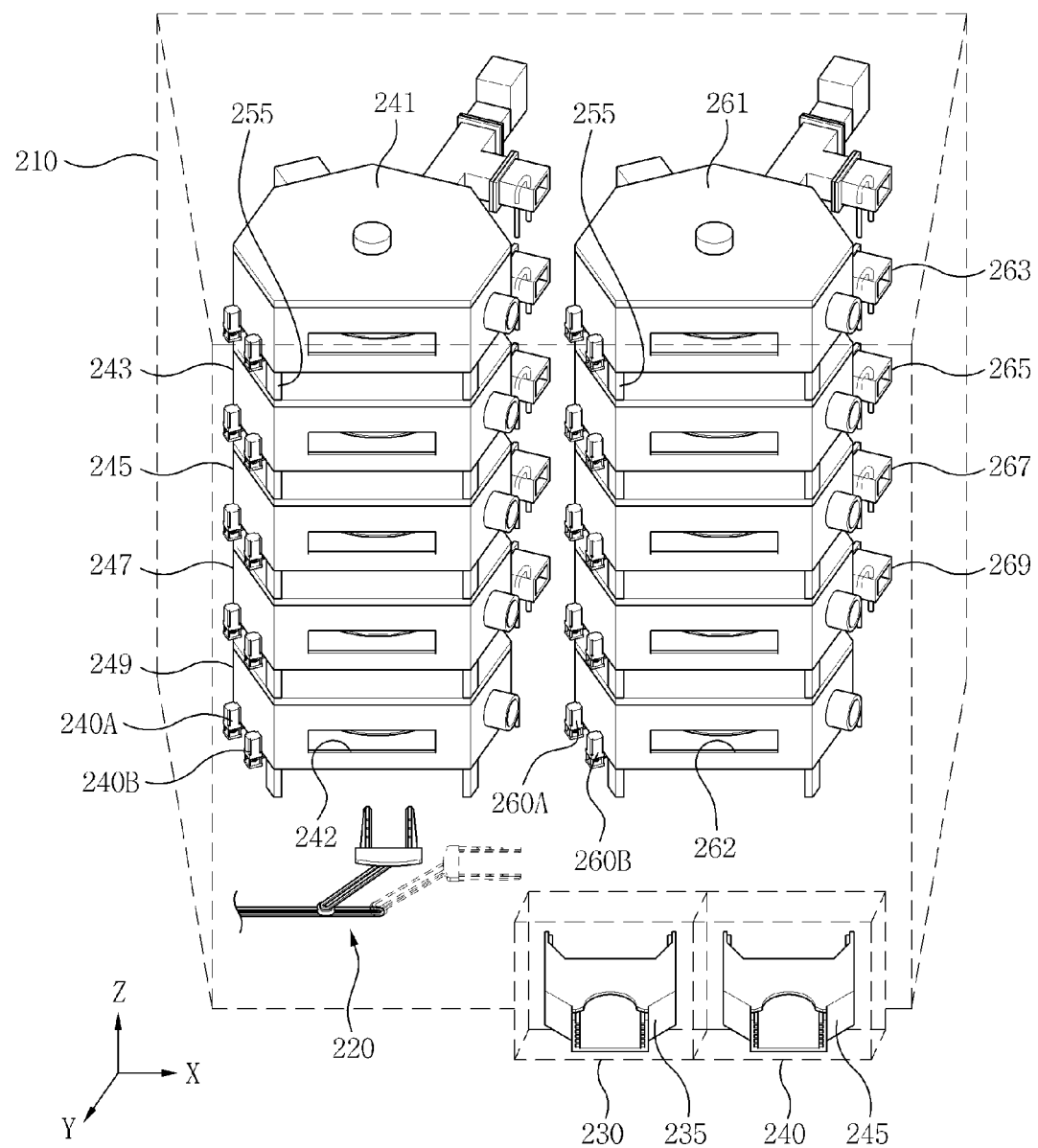
FIG. 8 is a schematic perspective view illustrating an apparatus for fabricating semiconductor devices according to example embodiments of the inventive concepts.

FIG. 8 is a schematic perspective view showing an apparatus for fabricating semiconductor devices according to example embodiments of the inventive concepts.

Referring to FIG. 8, an apparatus 290 for fabricating semiconductor devices according to example embodiments of the inventive concepts may include the same elements as the apparatus 280 for fabricating semiconductor devices. In this example embodiment, the apparatus 290 for fabricating semiconductor devices may have substrate gates 242 and 262 not facing each other, which is different from the apparatus 280 for fabricating semiconductor devices of FIG. 7.

FIGS. 9 to 13 are schematic views illustrating an operation of an apparatus for fabricating semiconductor devices of FIG. 5.

Figure 9:
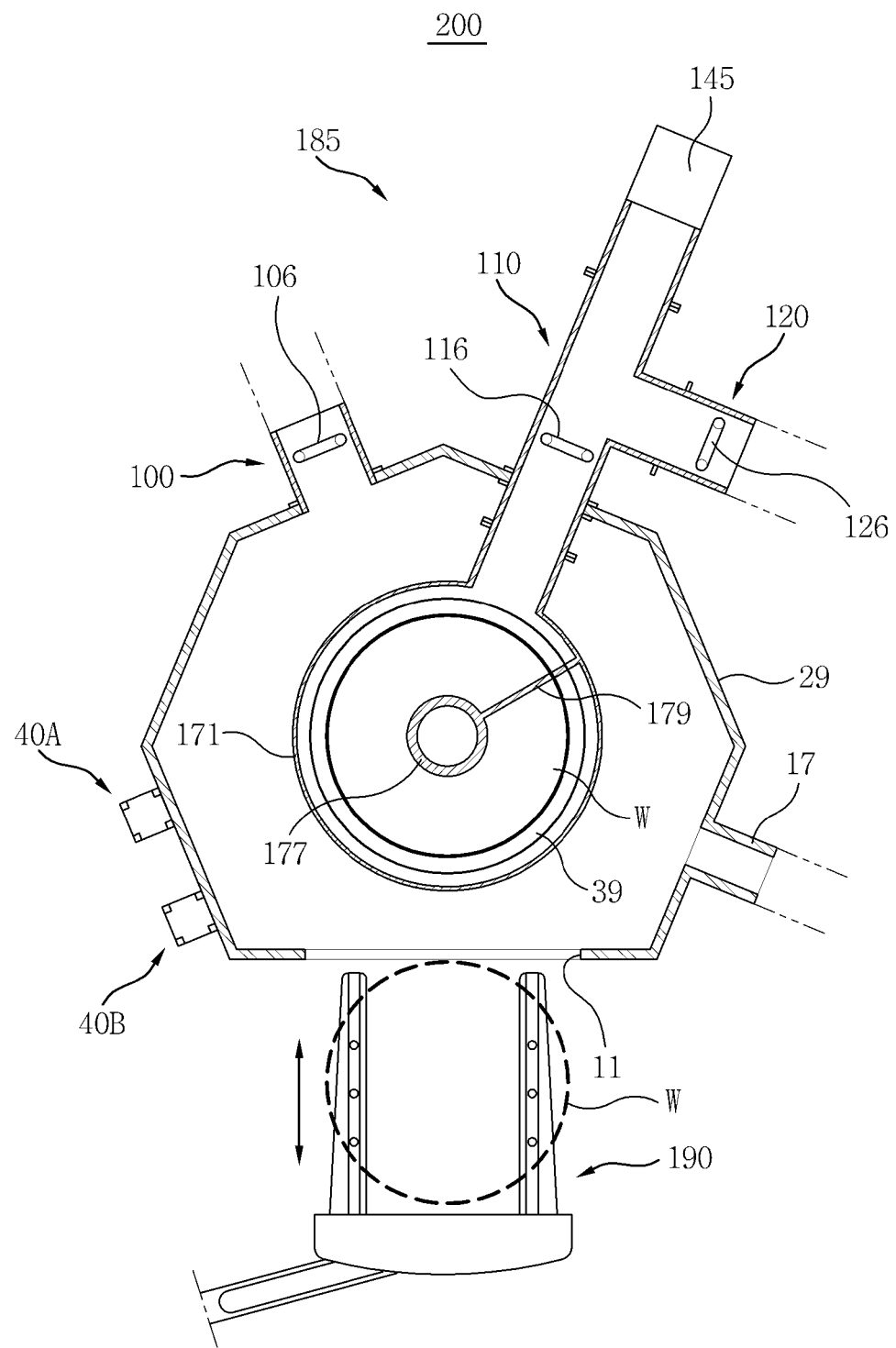
FIGS. 9 to 13 are schematic views illustrating an operation of an apparatus for fabricating semiconductor devices of FIG. 5.

Referring to FIG. 9, the apparatus 200 for fabricating semiconductor devices according to example embodiments of the inventive concepts may mount a semiconductor substrate W on the substrate transferring unit 190, which is located adjacent to the process performing unit 185. The substrate transferring unit 190 may be moved to the process chamber 29 of the process performing unit 185. In this example embodiment, the substrate transferring unit 190 may transfer the semiconductor substrate W toward the substrate gate 11 of the process chamber 29.

The semiconductor substrate W may include at least one redistribution and/or a polymer film in the uppermost level thereof. The at least one redistribution may be electrically connected to an integrated circuit, which is located under the uppermost level of the semiconductor substrate W. The at least one redistribution may comprise metal. The polymer film may cover the at least one redistribution.

The polymer film may comprise carbon. Continuously, the substrate transferring unit 190 may traverse the substrate gate 11 of the process chamber 29 and may mount the semiconductor substrate W on the process chuck 39. After the mounting of the semiconductor substrate W on the process chuck 39, the substrate transferring unit 190 may go back to the substrate gate 11, may again traverse the substrate gate 11 of the process chamber 29, and may be located adjacent to the process chamber 29.

Figure 10A:
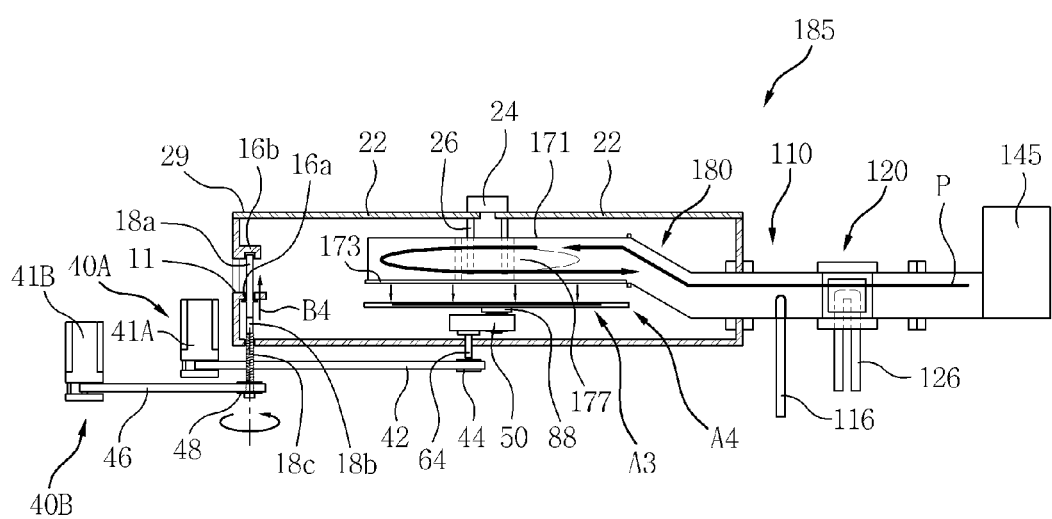
Figure 10B:
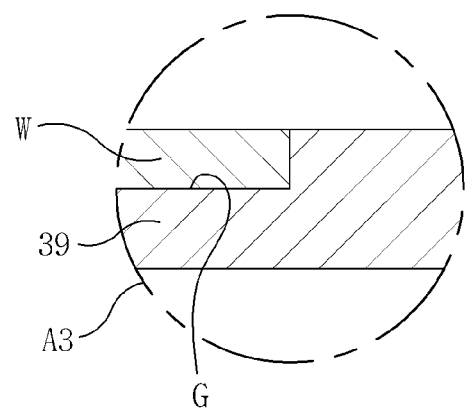

Referring to FIG. 10A, the semiconductor substrate W may be mounted in the groove G of the process chuck 39 as illustrated in an enlarged view of section A3 in FIG. 10B. A top surface of the semiconductor substrate W may be located on the same level as or a different level from a top surface of the process chuck 39. After the separation of the semiconductor transferring unit 190 from the process chamber 29, the apparatus 200 for fabricating semiconductor devices in FIG. 9 may provide power to the first and second driving parts 41A and 41B.

The second driving part 41B may rotate the pusher 18b, the second driving member 46 and the second body of rotation 48, and may move the door 18a in the fourth direction B4. In this example embodiment, the pusher 18b may move the door 18a such that the door 18a may contact the alignment bar 16b. The door 18a may close the substrate gate 11.

Continuously, the first driving part 41A may rotate the first driving member 42, the first body of rotation 44 and the first axis of rotation 64.

The first axis of rotation 64 may rotate the rotation housing 50 and the rotation transferring member 88. The rotation housing 50 may cause the process chuck 39 to revolve around the first axis of rotation 64. The rotation transferring member 88 may cause the process chuck 39 to rotate around the second axis of rotation 86 of FIG. 3.

Continuously, the apparatus 200 for fabricating semiconductor devices may provide power to the microwave machine 145. The microwave machine 145 may generate a microwave therein and may transmit the microwave into the wave guiding part 110 and the irradiating unit 180. The microwave may be moved along a wave tracing line P. The wave tracing line P may draw a circle between the side wall of the irradiating tube 171 and the side wall of the second protection tube 177. The microwave may be moved along the wave tracing line P to be irradiated on the process chuck 39 and the semiconductor substrate W through the irradiation guiding member 173.

Although the microwave may be transmitted to the first protection tube 26 via the second protection tube 177 from the irradiating tube 171, the microwave does not traverse the first protection tube 26 because a wavelength of the microwave is greater than a diameter of the first protection tube 26. As such, the first protection tube 26 may prolong the lifespan of the heat sensing part 24.

Figure 10C:
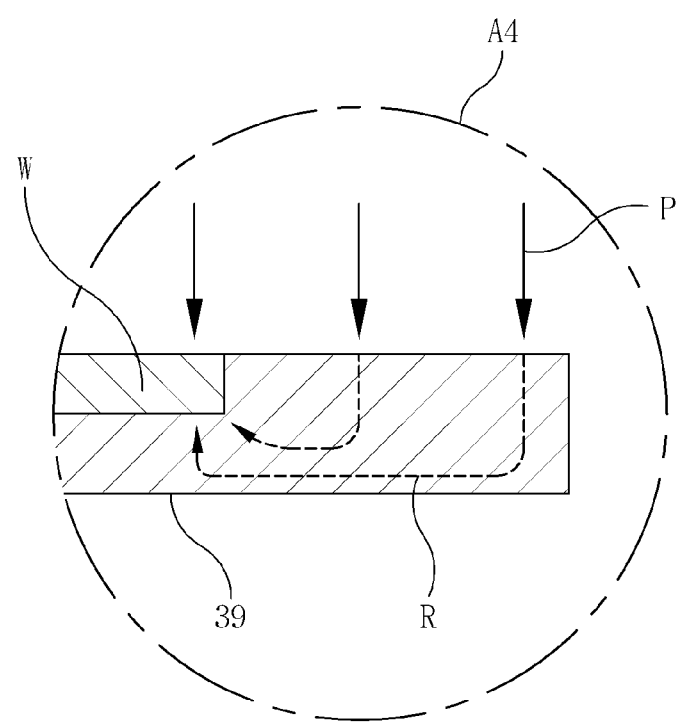

In the example embodiment in which the microwave is irradiated on the semiconductor substrate W as illustrated in an enlarged view of section A4 in FIG. 10C, the microwave may be absorbed as heat energy on a polymer film of the semiconductor substrate W to harden the polymer film. The heat energy may vaporize a volatile material from the polymer film to remove at least one void in the polymer film. As such, the heat energy may improve a characteristic of the polymer film.

Also, the heat energy may harden the organization (or structure) of the polymer film. In that the example embodiment in which the microwave is irradiated on the process chuck 39 as illustrated in FIG. 10C in the enlarged view of section A4, the heat energy may move along a heat tracing line R in the process chuck 39. That is, the microwave may use metal of the process chuck 39 as a medium to transmit the heat energy to the semiconductor substrate W along the heat tracing line R. The heat energy may be transmitted into the polymer film through the semiconductor substrate W.

The microwave may be reflected from the interior of the process chamber 29 toward the exterior of the process chamber 29 via the irradiating tube 171. That is, the microwave may be absorbed into the second fluid tube 116 of the wave guiding part 110 and/or the third fluid tube 126 of the absorbing part 120. In this example embodiment, the apparatus 200 for fabricating semiconductor devices may store the second and third fluid tubes 116 and 126 with a fluid or may flow the fluid through the second and third fluid tubes 116 and 126, while the microwave machine 145 is operated. The fluid may include a liquid which absorbs the heat energy of the microwave.

The fluid may include, for example, water having a temperature between 0° C. and 25° C. The second and third fluid tubes 116 and 126 may use the liquid to minimize an attack of the microwave to the microwave machine 145. While the microwave is irradiated on the semiconductor substrate W, the vaporized material from the polymer film may be exhausted through the exhaust port 17 of the process chamber 29 in FIGS. 1 and 9.

Once hardening of the polymer film is completed, the apparatus 200 for fabricating semiconductor devices may not provide power to the first driving part 41A and the microwave machine 145 to stop the process chuck 39 from being rotated in the process chamber 39 and the microwave machine 145 from generating a microwave. The apparatus 200 for fabricating semiconductor devices may again provide power to the second driving part 41B to rotate the pusher 18b, the second driving member 46 and the second body of rotation 48. The door 18a may open the substrate gate 11 of the process chamber 39 through a rotation of the pusher 18b.

In an embodiment in which the substrate gate 11 is opened, the apparatus 200 for fabricating semiconductor devices may not provide power to the second driving part 41B. The semiconductor substrate W may be lifted from the process chuck 39 by using lift pins (not shown) of the apparatus 200.

The substrate transferring unit 190 of FIGS. 1 and 9 may separate the semiconductor substrate W from the process chuck 39. The substrate transferring unit 190 may be moved from the process chuck 39 to the substrate gate 11. The apparatus 200 for fabricating semiconductor devices may repeatedly apply the above operation steps to subsequent semiconductor substrates. In the meantime, the apparatus 280 or 290 for fabricating semiconductor devices of FIG. 7 or 8 may apply the above operation steps of the apparatus for fabricating semiconductor devices 200, to each of the plurality of process performing units 241, 243, 245, 247, 249, 261, 263, 265, 267 and 269.

The apparatus 280 or 290 for fabricating semiconductor devices of FIG. 7 or 8 may simultaneously or independently operate a plurality of process performing units 241, 243, 245, 247, 249, 261, 263, 265, 267 and 269. Hereafter, a relationship between the wave tracing line P of the microwave, and a movement of the process chuck 39 will be described by referring to FIGS. 11 to 13.

Figure 11:
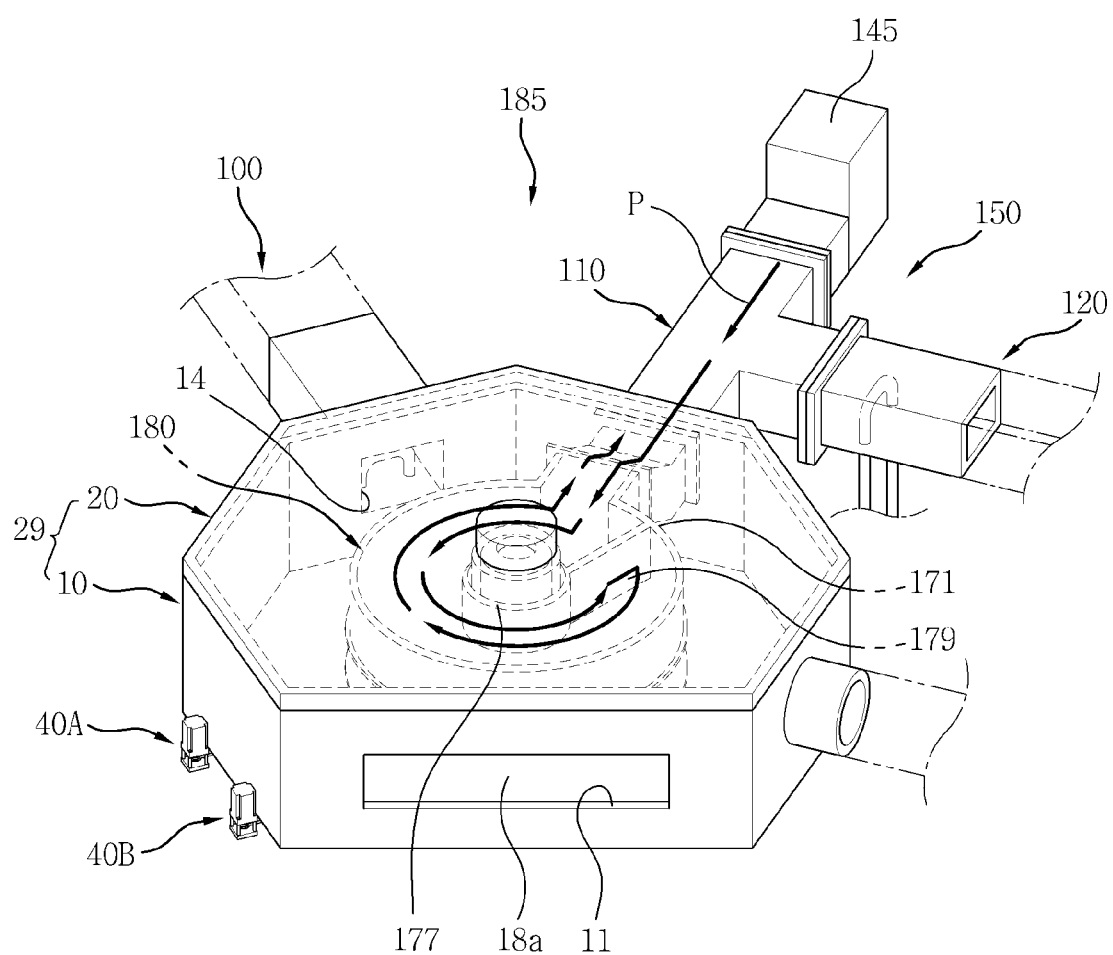

Referring to FIG. 11, the microwave may be transmitted to the wave guiding part 110 and the irradiating tube 171 along the wave tracing line P. Continuously, the microwave may be moved along a pathway between the irradiating tube 171 and the second protection tube 177 to arrive at the partition 179. While the microwave is moved in the irradiating tube 171, the microwave may be irradiated on the semiconductor substrate W through the irradiation guiding member 173, as shown in FIG. 10A.

Further, the microwave may collide with the partition 179 to go to the semiconductor substrate W as shown in FIG. 10A, or may be reflected from the partition 179 to move along the pathway between the irradiating tube 171 and the second protection tube 177. Continuously, the microwave may be reflected from the irradiating tube 171 and moved to the wave guiding part 110.

Figure 12:
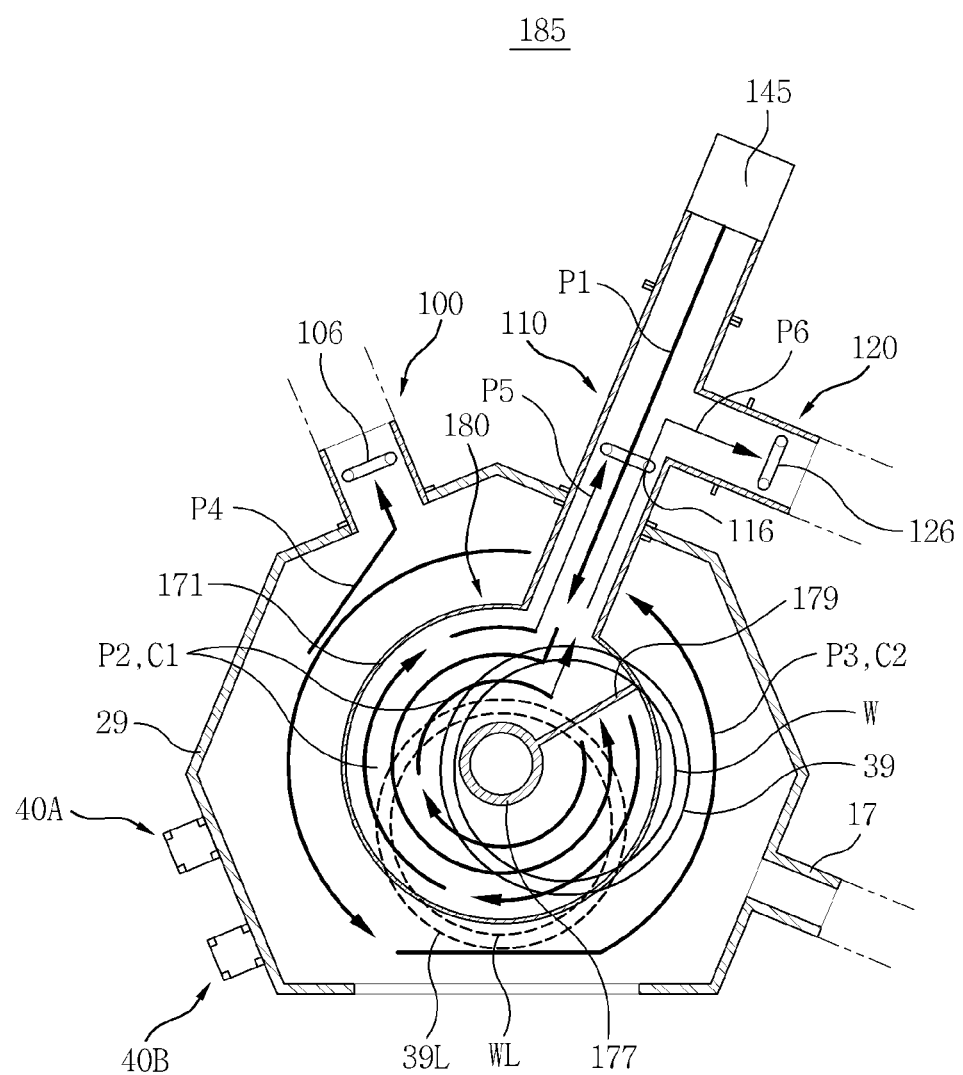

Referring to FIG. 12, so as to illustrate a movement path of the microwave in more detail, the wave tracing line P of the microwave may be subdivided into a plurality of wave tracing lines P1, P2, P3, P4, P5 and P6. In this example embodiment, the microwave may be transmitted into the wave guiding part 110 and the irradiating unit 180 along a wave tracing line P1 from the microwave machine 145. The microwave may traverse the pathway between the side wall of the irradiating tube 171 and the side wall of the second protection tube 177 to contact the partition 179.

The microwave may collide with the partition 179 to irradiate under the irradiating tube 171. The microwave may have circular wave tracing lines P2 in the irradiating tube 171 of the irradiating unit 180. The circular wave tracing lines P2 may be formed along a shape of the pathway between the side wall of the irradiating tube 171 and the side wall of the second protection tube 177. In this example embodiment, the circular wave tracing lines P2 may respectively correspond to contours C1, each of which may have one value obtained from the heat energy of the microwave.

While the microwave is irradiated on the process chuck 39 from the irradiating unit 180, the microwave may be irradiated into a periphery of the irradiating tube 171. This is because the irradiating tube 171 is spaced apart from the process chuck 39, as shown in FIG. 10A. The microwave may have at least one semicircular wave tracing line P3 along -a shape of a pathway between the process chamber 29 and the irradiating tube 171.

Because the side wall of the process chamber 29 is asymmetric, the at least one semicircular wave tracing line P3 may be asymmetrically formed. In this example embodiment, the at least one semicircular wave tracing line P3 may respectively correspond to at least one contour C2, each of which may have a value obtained from the heat energy of the microwave. The at least one semicircular wave tracing line P3 will be described in more detail in connection with FIG. 13.

While the microwave is irradiated from the irradiating tube 171, the process chuck 39 may revolve and rotate together with the semiconductor substrate W through the first axis of rotation 64 and the rotation transferring member 88 of FIG. 10A. Because the first axis of rotation 64 is located apart from a central region of the process chuck 39, the semiconductor substrate W and the process chuck 39 may make loci WL and 39L thereof in the periphery of the irradiating tube 171 to be partially exposed from the irradiating tube 171.

Because the semiconductor substrate W and the process chuck 39 meet the circular wave tracing lines P2 and the at least one semicircular wave tracing line P3 under the irradiating tube 171, the semiconductor substrate W and the process chuck 39 may receive heat energies from the microwave. The heat energies may have various values. However, in the example embodiment in which the semiconductor substrate W and the process chuck 39 are not exposed from the irradiating tube 171 and only rotate, the semiconductor substrate W and the process chuck 39 may meet only the circular wave tracing lines P2 under the irradiating tube 171.

As such, the semiconductor substrate W may uniformly receive the heat energies on a whole surface thereof from the microwave through the revolving and rotating of the process chuck 39 as compared with only the rotating of the process chuck 39. The polymer film on the semiconductor substrate W may be hardened within a shorter time through the revolving and rotating of the process chuck 39 as compared with only the rotating of the process chuck 39. In the meantime, the microwave may be reflected from the process chamber 29 in the periphery of the irradiating tube 171 to be transmitted to the at least one absorbing unit 100.

The at least one absorbing unit 100 may absorb the microwave corresponding to a wave tracing line P4 through the first fluid tube 106 of the at least one absorbing unit 100. The at least one absorbing unit 100 may store the first fluid tube 106 with a liquid, or may flow the liquid through the first fluid tube 106.

The at least one absorbing unit 100 may prevent an arc of the microwave from occurring in an edge of the process chuck 39. This is because the at least one absorbing unit 100 does not allow the microwave to arrive at a critical value of intensity causing the arc in an edge of the process chuck 39. Also, the microwave may be reflected from the irradiating tube 171 to the wave guiding part 110 and the absorbing part 120. The wave guiding part 110 and the absorbing part 120 may absorb the microwave corresponding to wave tracing lines P5 and P6 through second and third fluid tubes 116 and 126.

The at least one absorbing unit 100, the wave guiding part 110 and the absorbing part 120 can appropriately absorb the microwave reflected from the process chamber 29 to prevent the process chamber 29 from contamination, to prolong the lifespan of parts and to lengthen the cleaning period of the apparatus.

Figure 13:
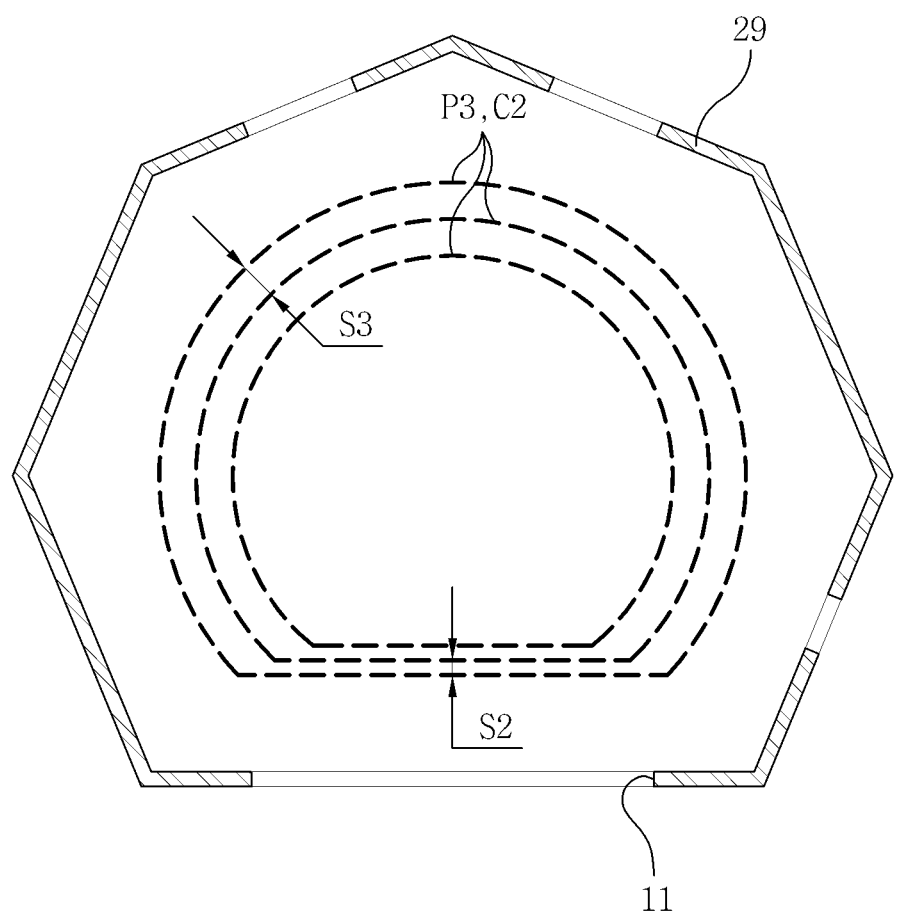

Referring to FIG. 13, the at least one semicircular wave tracing line P3 may correspond to a plurality of contours C2 in the periphery of the irradiating tube 171 within the process chamber 29 of FIG. 12. Each of the plurality of contours C2 may be in a shape of a semicircle due to the asymmetry of the side wall of the process chamber 29. In this example embodiment, the plurality of contours C2 may have different occupied densities along the side wall of the process chamber 29.

That is, a spacing S2 of the plurality of the contours C2 in a periphery of a substrate gate 11 may be smaller than a spacing S3 of the plurality of the contours C2 opposite to substrate gate 11. Because the plurality of the contours C2 are asymmetric, the semiconductor substrate W of FIG. 12 may receive various values of heat energies from the microwave within the process chamber 29 of FIG. 12.

Figure 14:
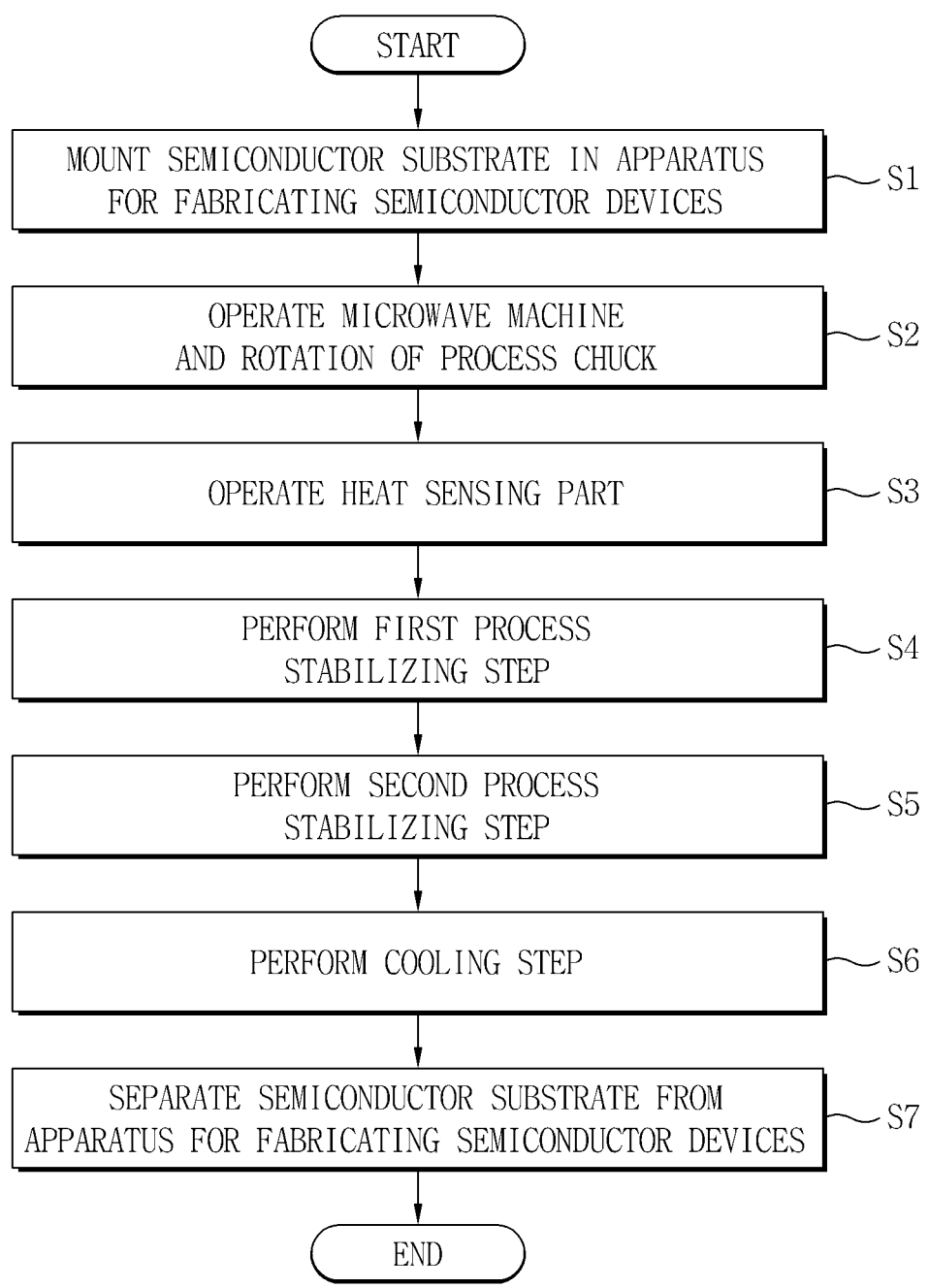
FIG. 14 is a flowchart illustrating a method of forming a semiconductor package in a wafer level using an apparatus of fabricating semiconductor devices of FIG. 5.

FIG. 14 is a flowchart illustrating a method of forming a semiconductor package in a wafer level using the apparatus of fabricating semiconductor device of FIG. 5. Further, FIG. 15 is a graph related to a process, which is used in the apparatus of fabricating semiconductor device of FIG. 5.

Figure 15:
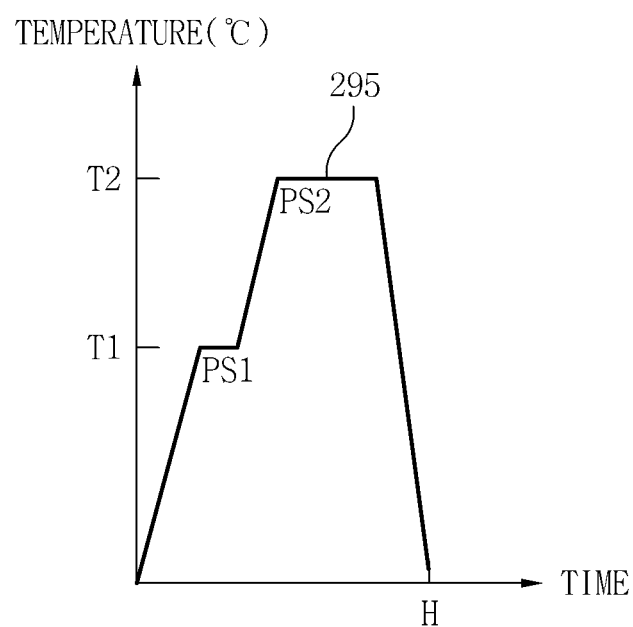
FIG. 15 is a graph related to a process, which is used by an apparatus for fabricating semiconductor devices of FIG. 5.

Referring to FIGS. 14 and 15, the apparatus 200 for fabricating semiconductor devices of FIG. 5 may be used together with the semiconductor substrate W of FIG. 9. The semiconductor substrate W may include at least one redistribution and a polymer film in the uppermost level of the semiconductor substrate W. The semiconductor substrate W may be mounted on the substrate mounting unit 30 in the process chamber 29 of FIG. 5. The substrate mounting unit 30 may include the process chuck 39 of FIG. 9.

In this example embodiment, the semiconductor substrate W may be mounted on the process chuck 39 (S1). The apparatus 200 for fabricating semiconductor devices may operate the microwave machine 145 of FIG. 9 (S2), which is adjacent to the process chamber 29. The microwave machine 145 may generate a microwave therein and transmit the microwave to the irradiating tube 171 in the process chamber 29. The microwave may be irradiated on the process chuck 39 from the irradiating tube 171.

Movement of the microwave between the microwave machine 145 and the irradiating tube 171 may be understood by referring to FIGS. 10 to 12 and the above description. While the microwave is irradiated on the semiconductor substrate W, the apparatus 200 for fabricating semiconductor devices may operate the process chuck 39 (S2). The process chuck 39 may rotate through the apparatus 200 for fabricating semiconductor devices (S2). The rotary motion of the process chuck 39 may be understood by referring to FIGS. 10 to 12 and the above description.

While the process chuck 39 rotates, the apparatus 200 for fabricating semiconductor devices may operate the heat sensing part 24 of FIG. 5 (S3). The heat sensing part 24 may sense a radiant light of the semiconductor substrate W to monitor a temperature of the semiconductor substrate W in real time. In this example embodiment, the apparatus 200 for fabricating semiconductor devices may be programmed based on a reference data in the interior thereof. The reference data may have desired temperature values corresponding respectively to desired times with respect to the semiconductor substrate W.

Accordingly, while the apparatus 200 for fabricating semiconductor devices may be operated along a process of FIG. 15, the apparatus 200 for fabricating semiconductor devices may confirm whether or not the semiconductor substrate W has arrived at a desired temperature corresponding to a desired process time. If the semiconductor substrate W does not arrive at the desired temperature corresponding to the desired process time, the apparatus 200 fabricating semiconductor devices may adjust the power of the microwave machine 145 to reach the desired temperature of the semiconductor substrate W.

While the microwave is irradiated to the semiconductor substrate W, the temperature of the semiconductor substrate W may steeply rise along process times as shown in FIG. 15 to arrive at a first temperature T1 in a line 295. The semiconductor substrate W may be maintained at the first temperature T1 for a predetermined time. The first temperature T1 may be, for example, between about 100° C. and about 120° C.

The apparatus 200 for fabricating semiconductor devices may apply a first process stabilizing step PS1 to the semiconductor substrate W at the first temperature T1 (S4). The apparatus 200 for fabricating semiconductor devices may vaporize a volatile material from the polymer on the semiconductor substrate W through the first process stabilizing step PS1. As such, the polymer film may be free from a void.

Continuously, the apparatus 200 for fabricating semiconductor devices may operate the microwave machine 145 to further raise the temperature of the semiconductor substrate W from the first temperature T1. In this example embodiment, the apparatus 200 for fabricating semiconductor devices may confirm whether or not the semiconductor substrate W has arrived at a desired temperature corresponding to a desired time through the heat sensing part 24 and the reference data.

The temperature of the semiconductor substrate W may steeply rise along process times as shown in FIG. 15 to arrive at a second temperature T2 in the line 295. The semiconductor substrate W may be maintained at the second temperature T2 for a predetermined time. The second temperature T2 may be, for example, between about 180° C. and about 200° C. . The apparatus 200 for fabricating semiconductor devices may apply a second process stabilizing step PS2 to the semiconductor substrate W at the second temperature T2 (S5).

The apparatus 200 for fabricating semiconductor devices may harden the organization (or structure) of the polymer film on the semiconductor substrate W through the second process stabilizing step PS2. In this example embodiment, the apparatus 200 for fabricating semiconductor devices may vaporize a volatile material from the polymer film and harden the organization of the polymer film. The polymer film may have an immunity to an exterior shock through the second process stabilizing step PS2.

Subsequently, the apparatus 200 for fabricating semiconductor devices may apply a cooling step to the semiconductor substrate W (S6). The cooling step may steeply drop the temperature of the semiconductor substrate W from the second temperature T2. In this example embodiment, the apparatus 200 for fabricating semiconductor devices may confirm whether or not the semiconductor substrate W has arrived at a desired temperature corresponding to a desired time through the heat sensing part 24 and the reference data.

The temperature of the semiconductor substrate W may arrive at a room temperature through the cooling step. The apparatus 200 for fabricating semiconductor devices may perform all of the first process stabilizing step PS1, the second process stabilizing step PS2 and the cooling step within a desired time, between 1 and 2 hours. When the temperature of the semiconductor substrate W reaches room temperature, the semiconductor substrate W may be separated from the apparatus 200 for fabricating semiconductor devices (S7).

The apparatus 200 for fabricating semiconductor devices may have different temperatures and different times from those described above in connection with the first process stabilizing step PS1, the second process stabilizing step PS2 and/or the cooling step with respect to various kinds of polymer films. The apparatus 280 or 290 for fabricating semiconductor devices of FIG. 7 or 8 may perform the method of forming the semiconductor package in the wafer level of FIGS. 14 and 15 with respect to the process performing units 241, 243, 245, 247, 249, 261, 263, 265, 267 and 269 thereof.

As described above, example embodiments of the inventive concepts provide an apparatus for fabricating semiconductor devices, which may uniformly transmit energy of a microwave to a polymer film on a semiconductor substrate, and may harden the polymer film within a shorter time than a thermal cure.

Further, example embodiments of the inventive concepts provide an apparatus for fabricating semiconductor devices, which may appropriately absorb a microwave reflected from a process chamber to lengthen the cleaning period of the apparatus.

Furthermore, example embodiments of the inventive concepts provide an apparatus for fabricating semiconductor devices, which may minimize deterioration of a heat sensing part due to a microwave to prolong lifespan of the heat sensing part.

While the inventive concept has been particularly shown and described with reference to exemplary embodiments thereof, it will be understood that various substitutions, modifications, and changes in form and details may be made therein without departing from the spirit and scope of the following claims.

What is claimed is:

1. An apparatus for fabricating semiconductor devices comprising:
    a chamber having a bottom plane, a side wall and a lid;
    an irradiating unit at an interior of the chamber; and
    a substrate mounting unit between the bottom plane of the chamber, and the irradiating unit,
    wherein the irradiating unit comprises an irradiating tube and a hole penetrating a central region of the irradiating tube, the irradiating tube has a hollow disk shape, and a lower surface of the irradiating tube is open to the substrate mounting unit.

2. The apparatus for fabricating semiconductor devices of claim 1, wherein the bottom plane is in a shape of an asymmetric polygon, and the side wall includes a plurality of surfaces corresponding respectively to a plurality of sides of the asymmetric polygon.

3. The apparatus for fabricating semiconductor devices of claim 1, wherein the irradiating tube comprises a partition separating an inner space of the irradiating tube.

4. The apparatus for fabricating semiconductor devices of claim 1, further comprising a supply unit exterior to the chamber,
wherein the supply unit comprises a first wave guiding tube, an absorbing tube and a microwave machine, the first wave guiding tube has one end communicating with the irradiating unit and the other end extending from the side wall of the chamber to a position exterior to the chamber.

5. The apparatus for fabricating semiconductor devices of claim 4, wherein the other end of the first wave guiding tube comprises a first passageway connected to the absorbing tube, and a second passageway connected to the microwave machine.

6. The apparatus for fabricating semiconductor devices of claim 4, wherein the irradiating unit comprises a second wave guiding tube communicating with the supply unit through the side wall of the chamber.

7. The apparatus for fabricating semiconductor devices of claim 1, further comprising an absorbing unit at a position exterior to the chamber,
wherein the absorbing unit communicates with the interior of the chamber through the side wall of the chamber.

8. The apparatus for fabricating semiconductor devices of claim 1, wherein the irradiating unit further comprises an irradiation guiding member, the irradiation guiding member comprises a plurality of slits, and the lower surface of the irradiating tube is covered with the irradiation guiding member.

9. The apparatus for fabricating semiconductor devices of claim 8, wherein the plurality of slits are formed as at least one of concentric circles and in a spiral shape.

10. The apparatus for fabricating semiconductor devices of claim 1, wherein the substrate mounting unit comprises a process chuck having a central region and a peripheral region, and the central region and the peripheral region have a step difference with respect to each other.

11. The apparatus for fabricating semiconductor devices of claim 10, wherein the process chuck comprises metal.

12. The apparatus for fabricating semiconductor devices of claim 10, further comprising a rotation unit under the substrate mounting unit,
wherein the rotation unit revolves and rotates the process chuck.

13. The apparatus for fabricating semiconductor devices of claim 1, further comprising a heat sensing part on the lid of the chamber.

14. The apparatus for fabricating semiconductor devices of claim 13, further comprising a protection tube aligned with the heat sensing part under the lid of the chamber,
wherein the protection tube penetrates the irradiating tube through the hole of the irradiating tube, and the heat sensing part faces the substrate mounting unit through the protection tube.

15. An apparatus for fabricating semiconductor devices comprising:
a chamber comprising a bottom plane and a lid shaped as an asymmetric polygon, and a side wall having a same number of surfaces as sides of the polygon;
an irradiating unit at a central region of an interior of the chamber;
a process chuck between the bottom plane of the chamber, and the irradiating unit,
wherein the irradiating unit comprises a hollow ring on the process chuck, one end of the irradiating unit is closed, and the other end of the irradiating unit is fixed to the side wall of the chamber.

16. An apparatus for fabricating semiconductor devices comprising:
a partially enclosed chamber;
an irradiating unit at an interior of the chamber having a hollow disk shape;
a substrate mounting unit between a bottom of the chamber, and the irradiating unit; and
a rotation unit, a portion of the rotation unit being between the substrate mounting unit and the bottom of the chamber,
wherein the rotation unit revolves and rotates the substrate mounting unit.

17. The apparatus for fabricating semiconductor devices of claim 16, wherein the chamber further comprises a bottom plane, a side wall and a lid, and wherein the bottom plane is in a shape of an asymmetric polygon, and the side wall includes a plurality of surfaces corresponding respectively to a plurality of sides of the asymmetric polygon.

18. The apparatus for fabricating semiconductor devices of claim 16, further comprising a heat sensing part on a lid of the chamber.

19. The apparatus for fabricating semiconductor devices of claim 18, further comprising a protection tube aligned with the heat sensing part under the lid of the chamber,
wherein the irradiating unit comprises an irradiating tube and a hole penetrating a central region of the irradiating tube
wherein the protection tube penetrates the irradiating tube through the hole of the irradiating tube, and the heat sensing part faces the substrate mounting unit through the protection tube.

20. The apparatus for fabricating semiconductor devices of claim 16, wherein the irradiating unit further comprises an irradiating tube and an irradiation guiding member, the irradiation guiding member comprises a plurality of slits, and the lower surface of the irradiating tube is covered with the irradiation guiding member.

* * * * *